(12) United States Patent
Konushi et al.

(10) Patent No.: US 6,266,227 B1
(45) Date of Patent: Jul. 24, 2001

(54) THIN-FILM CAPACITOR

(75) Inventors: Shigeo Konushi; Tsuneo Mishima, both of Kokubu (JP)

(73) Assignee: Kyocera Corporation, Kjoto (JP)

( * ) Notice: Subject to any disclaimer, the term of this patent is extended or adjusted under 35 U.S.C. 154(b) by 0 days.

(21) Appl. No.: 09/383,878

(22) Filed: Aug. 26, 1999

(30) Foreign Application Priority Data

| Aug. 26, 1998 | (JP) | 10-240911 |
| Sep. 29, 1998 | (JP) | 10-276196 |
| Mar. 30, 1999 | (JP) | 11-089968 |
| Apr. 27, 1999 | (JP) | 11-120386 |
| May 27, 1999 | (JP) | 11-148690 |

(51) Int. Cl.$^7$ .......... H01G 4/228; H01G 4/005; H01G 4/06
(52) U.S. Cl. .......... 361/306.1; 361/303; 361/320; 361/321.2
(58) Field of Search .......... 361/301.4, 303, 361/304, 305, 306.1, 306.3, 307, 308.1–308.3, 309, 310, 311, 321.1–321.5, 328, 329, 330

(56) References Cited

U.S. PATENT DOCUMENTS

| 4,470,096 | * | 9/1984 | Guertin | 361/277 |
| 5,583,359 | * | 12/1996 | Ng et al. | 257/306 |
| 5,939,766 | * | 8/1999 | Stolmeijer et al. | 257/534 |
| 6,104,597 | * | 8/2000 | Konushi et al. | 361/301.4 |

* cited by examiner

Primary Examiner—Dean A. Reichard
Assistant Examiner—Eric Thomas
(74) Attorney, Agent, or Firm—Hogan & Hartson, L.L.P.

(57) ABSTRACT

A thin-film capacitor in which a plurality of capacitor elements are arranged side by side, each capacitor element being constituted by a dielectric layer, a first electrode layer formed on the lower surface of said dielectric layer, and a second electrode layer formed on the upper surface of said dielectric layer, wherein among the neighboring capacitor elements, there are provided first terminal electrode layers for connecting the neighboring first electrode layers together, and second terminal electrode layers for connecting the neighboring second electrode layers together; said first terminal electrode layers and said second terminal electrode layers are so arranged as will not be overlapped one upon the other; and said first and second terminal electrode layers are provided with an external terminal, respectively. The capacitor can be easily mounted on an external board and has a low-inductance structure.

18 Claims, 14 Drawing Sheets

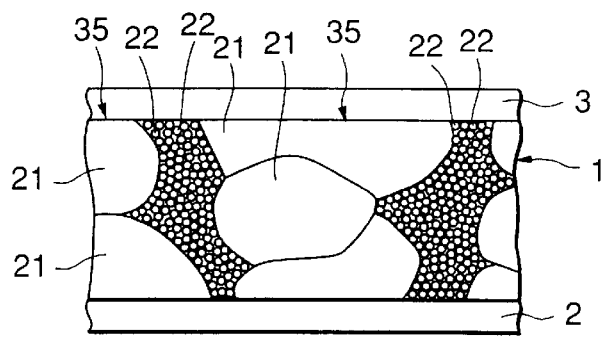
FIG.16
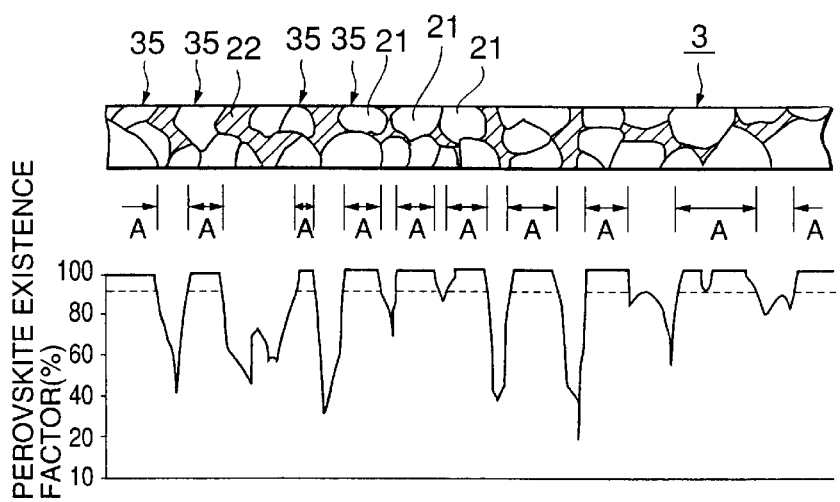
FIG.17a
FIG.17b
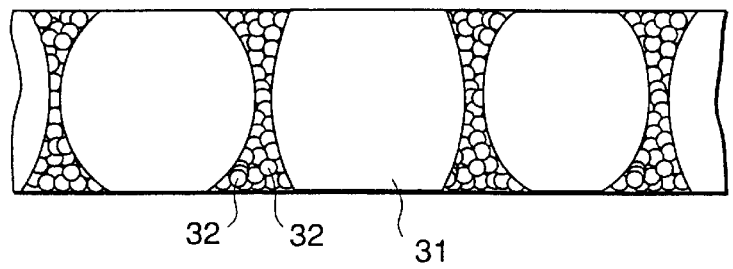
FIG.18

THIN-FILM CAPACITOR

BACKGROUND OF THE INVENTION

1. Field of the Invention

The present invention relates to a thin-film capacitor and, particularly, to a thin-film capacitor having a large capacity and a low inductance arranged, for example, in an electric circuit that operates at high speeds, and works for by-passing high-frequency noise or for preventing a change in the power source voltage, and to a board equipped with such a thin-film capacitor.

2. Description of the Prior Art

Accompanying the recent trend toward realizing electronic equipment in small sizes yet maintaining highly sophisticated functions, it has been strongly urged to provide electronic parts having small sizes and reduced thicknesses so that they can be installed in the electronic equipment to cope with the demand for high-frequency use.

In a high-speed digital circuit of a computer that must process large quantity of data at high speeds, in particular, the clock frequency in a CPU chip is as high as from 100 MHz to several hundred MHz and the clock frequency of a bus among the chips is also as high as from 30 MHz to 100 MHz even on a level of a personal computer.

As the degree of integration of LSI increases and the number of elements increases in the chip, further, the power source voltage must be lowered to suppress the consumption of electric power. As the IC circuits are highly densely arranged to operate at high speeds at low voltages, passive parts such as capacitors must also be designed in small sizes yet having large capacities to exhibit excellent characteristics for high-frequency pulses or high-speed pulses.

In order to realize a capacitor of a small size yet having a large capacity, the most effective method is to decrease, like a thin film, the thickness of the dielectric held by a pair of electrodes. The thin film meets the above-mentioned trend toward lowering the voltage.

Problems that arouse accompanying the high-speed operation of the IC circuit are more serious than realizing the individual elements in small sizes. Among them, what is particularly important in removing high-frequency noise, which is the role of a capacitor, is the function for suppressing an instantaneous drop in the power source voltage that occurs when the logic circuits are simultaneously switched over by instantaneously supplying energy stored in the capacitor. The capacitor having such a function is a so-called decoupling capacitor.

Performance required for the decoupling capacitor is to how quickly supply an electric current in response to a change in the current in the load unit that varies faster than the clock frequency. Therefore, the decoupling capacitor must reliably work over a frequency region of from 100 MHz to 1 GHz.

In practice, however, the capacitor element includes a resistance component and an inductance component in addition to the electrostatic capacity component. The impedance due to the capacity component decreases with an increase in the frequency, but the impedance due to the inductance component increases with an increase in the frequency. As the operation frequency increases, therefore, the inductance possessed by the element limits the transient current that is to be supplied causing an instantaneous drop in the power source voltage on the side of the logic circuit or newly generating voltage noise. As a result, an error occurs on the logic circuit.

In modern LSIs, in particular, the power source voltage has been lowered to suppress an increase in the consumption of electric power that results from an increase in the total number of elements, and the width of permissible change in the power source voltage has been decreased. In order to minimize the width of change in the voltage of during the high-speed operation, therefore, it becomes very important to decrease the inductance possessed by the decoupling capacitor element.

There are three methods of decreasing the inductance. A first method is to minimize the length of the current path, a second method is to cancel the magnetic field formed by a current path by a magnetic field formed by another current path located close thereto, and a third method is to divide the current path into a number of n to decrease the effective inductance down to 1/n.

The first method is to decrease the size by increasing the capacity per a unit area, and is accomplished by realizing the capacitor in the form of a thin film. Japanese Unexamined Patent Publication (Kokai) No. 94716/1985 discloses a dielectric in the form of a thin film having a thickness of not larger than 1 $\mu$m in order to obtain a capacitor having a large capacity and favorable high-frequency characteristics.

When a decoupling capacitor that can be mounted on a desired place is taken into consideration, however, the size must be larger than about 0.5 mm×0.5 mm so that it can be handled. According to the first method of decreasing the thickness of the film and decreasing the size, therefore, limitation is imposed on decreasing the inductance.

It can be contrived to use the above-mentioned first to third methods in combination without yet, however, making it possible to obtain a thin-film capacitor having sufficient characteristics from the standpoint of decreasing the size, decreasing the thickness, increasing the capacity and operating at high frequencies.

SUMMARY OF THE INVENTION

The object of the present invention, therefore, is to provide a thin-film capacitor that can be easily mounted and that has a low-inductance structure.

Another object of the present invention is to provide a thin-film capacitor that can be easily produced by laminating dielectric layers and electrode layers.

According to the present invention, there is provided a thin-film capacitor in which a plurality of capacitor elements are arranged side by side, each capacitor element being constituted by a dielectric layer, a first electrode layer formed on the lower surface of said dielectric layer, and a second electrode layer formed on the upper surface of said dielectric layer; wherein among the neighboring capacitor elements, there are provided first terminal electrode layers for connecting the neighboring first electrode layers together, and second terminal electrode layers for connecting the neighboring second electrode layers together;

said first terminal electrode layers and said second terminal electrode layers are so arranged as will not be overlapped one upon the other; and said first and second terminal electrode layers are provided with an external terminal, respectively.

According to the present invention, there is further provided a thin-film capacitor in which a plurality of capacitor elements are arranged side by side, each capacitor element having a plurality of first electrode layers and a plurality of second electrode layers alternatingly arranged from the lower side, and having dielectric layers arranged between the first electrode layers and the second electrode layers; wherein among the neighboring capacitor elements, there are provided first terminal electrode layers for connecting the neighboring first electrode layers together on the same plane, and second terminal electrode layers for connecting the neighboring second electrode layers together on the same plane;

said first terminal electrode layers and said second terminal electrode layers are so arranged as will not be overlapped one upon the other; and said first terminal electrode layers which are the uppermost layers and said second terminal electrode layers which are the uppermost layers, are provided with an external terminal, respectively.

In the thin-film capacitor of the present invention, the electrode layers (i.e., first electrode layers or second electrode layers) having the same polarities of the capacitor elements arranged side by side, are connected together through terminal electrode layers (first terminal electrode layers or second terminal electrode layers) located among the capacitor elements, and the terminal electrode layers are provided with external terminals. Therefore, each capacitor element is divided into a plurality of sections and the current paths are divided, too, to decrease the inductance.

Besides, each terminal electrode layer is provided with the external terminal to take out the electric charge. Here, the first terminal electrode layers and the second terminal electrode layers can be arranged close to each other to shorten the distance between the terminal electrode layers. As a result, the current path is effectively shortened and, hence, the inductance is further decreased.

The thin-film capacitor of the present invention can be easily produced by laminating the electrode layers and the dielectric layers like the conventional capacitors but changing the shape of the electrodes of the conventional capacitors. Besides, the external terminals for making a contact to the external boards such as external circuits are formed on the terminal electrode layers that are not overlapped on the dielectric layers, making it possible to effectively prevent damage to the capacitor elements caused by the stress of heat generated when the external terminals are being formed. Accordingly, no consideration needs be paid to damage caused by the thermal stress, and the mounting can be accomplished very easily.

BRIEF DESCRIPTION OF THE DRAWINGS

FIG. 14a is a view illustrating a current path in the capacitor of FIG. 13a;

FIG. 16 is a view illustrating a sectional structure of the dielectric layer in the thin-film capacitor according to the present invention;

FIG. 17a is a photograph illustrating the cross section of the dielectric layer of FIG. 16;

FIG. 17b is a diagram of a curve representing the perovskite existence factor in the dielectric layer as found from the photograph of cross section of FIG. 17a; and FIG. 18 is a view illustrating a preferred sectional structure of the dielectric layers in the thin-film capacitor according to the present invention.

DETAILED DESCRIPTION OF THE INVENTION

The present invention will now be described in detail by way of embodiments shown in the attached drawings.

Figure 1:
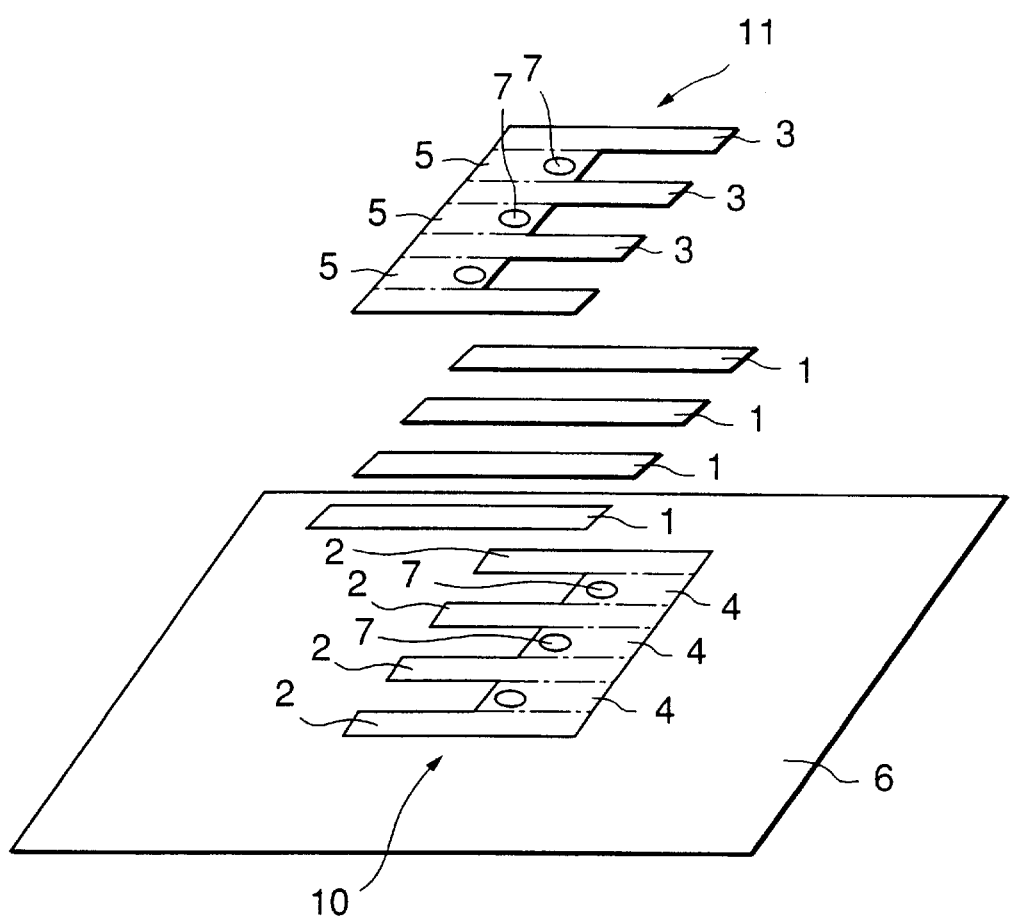
FIG. 1 is a disassembled perspective view of a thin-film capacitor of the single-plate type according to the present invention.
Figure 2:
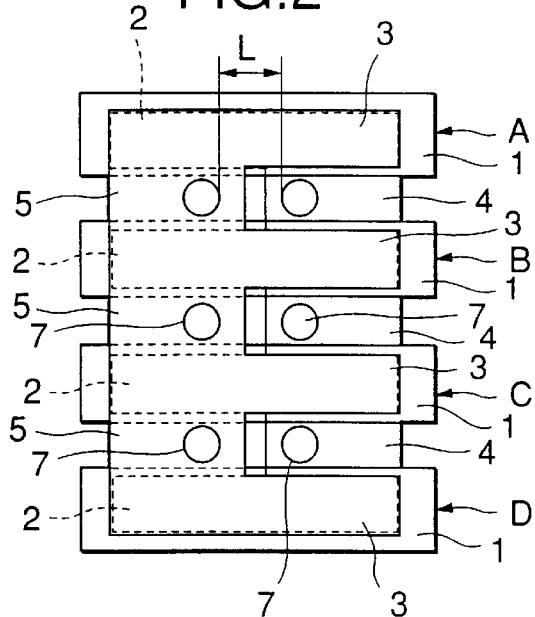
FIG. 2 is a plan view of the thin-film capacitor of FIG. 1.

Referring to FIGS. 1 and 2 (FIG. 1 is a disassembled perspective view and FIG. 2 is a plan view) showing a thin-film capacitor of the single-plate type of the present invention, the thin-film capacitor includes four capacitor elements A, B, C and D arranged side by side on a dielectric substrate (supporting substrate) 6 maintaining a predetermined gap. Each capacitor element is constituted by a dielectric layer 1, a first electrode layer 2 of, for example, the positive polarity, and a second electrode layer 3 of, for example, the negative polarity, the first electrode layer being formed on the lower surface of the dielectric layer 1 and the second electrode layer being formed on the upper surface of the dielectric layer 1.

First terminal electrode layers 4 and second terminal electrode layers 5 are provided among the capacitor elements A, B, C and D. The first electrode layers 2 of the capacitor elements are connected together through the first terminal electrode layers 4, and the second electrode layers 3 are connected together through the second terminal electrode layers 5. That is, the first terminal electrode layers 4 connecting the first electrode layers 2 together and the second terminal electrode layers connecting the second electrode layers 3 together, are so formed as will not be overlapped one upon the other. External terminals 7 exposed to the outer side are formed on the upper surfaces of the terminal electrode layers 4 and 5.

As shown in FIG. 1, the thin-film capacitor of the above-mentioned constitution has a laminated structure in which the four dielectric layers 1 are sandwiched between a first electrode portion 10 formed by integrally connecting the four first electrode layers 2 by the first terminal electrode layers 4 and a second electrode portion 11 formed by integrally connecting the four second electrode layers 3 by the second terminal electrode layers 5. That is, the electrode portions 10, 11, and the four dielectric layers 1 are so laminated that the four dielectric layers are located between the electrode layers 2 of the first electrode portion 10 and the electrode layers 3 of the second electrode portion 11, and that the terminal electrode layers 4 of the first electrode portion 10 and the terminal electrode layers 5 of the second electrode portion 11 are not overlapped one upon the other.

FIGS. 3a to 3d illustrate representative shapes of the first and second electrode portions 10, 11 and of the dielectric layers 1 in the above-mentioned thin-film capacitor of the present invention.

Figure 3A:
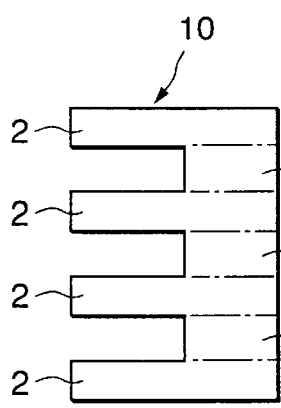
FIGS. 3a to 3d are views illustrating the shapes of first electrode portions, second electrode portions and dielectric layers in the thin-film capacitor of FIG. 1.
Figure 3B:
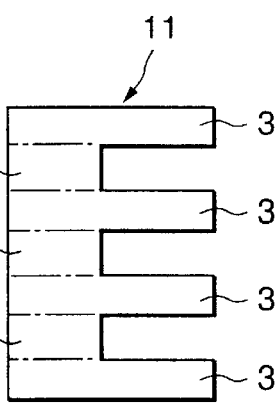

That is, as shown in FIGS. 3a and 3b, the four electrode layers 2 or 3 extending in parallel of the electrode portion 10 or 11, are connected together through the terminal electrode layers 4 or 5, defining a comb shape as a whole. Besides, the terminal electrode layers (first terminal electrode layers) 4 formed for the first electrode portion 10 and the terminal electrode layers (second terminal electrode layers) 5 formed for the second electrode portion 11, are so located as will not be overlapped one upon the other when these electrode portions are overlapped one upon the other. The electrode layers (first electrode layers) 2 of the first electrode portion 10 and the electrode layers (second electrode layers) 3 of the second electrode portion 11 are so located as will be overlapped one upon the other when these electrode portions are overlapped one upon the other, and have substantially the same shape and the same size. In FIGS. 3a and 3b, the electrode layers 2 and 3 have a rectangular shape. However, there is no particular limitation on the shape, and the electrode layers 2 and 3 may have, for example, a square shape or a circular shape.

Figure 3C:
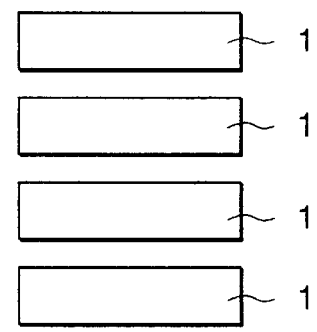
Figure 3D:
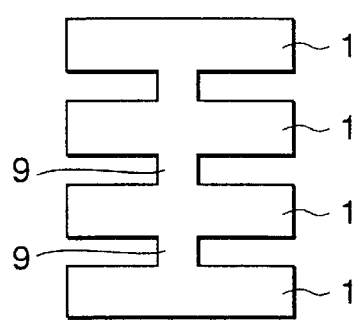

Referring to FIG. 3c, the four dielectric layers 1 have a size large enough for covering the first electrode layers 2 or the second electrode layers 3. In this drawing, the dielectric layers 1 have a rectangular shape. However, there is no particular limitation on the shape of the dielectric layers, as a matter of course. The four dielectric layers 1 may be separated away maintaining a predetermined gap or may be linked to each other through connection portions 9 formed of the same dielectric material as the dielectric layer 1 as shown in FIG. 3d. By providing such connection portions 9, the insulation can be improved between the first terminal electrode layers 4 and the second terminal electrode layers 5 having different polarities. Besides, the four dielectric layers 4 formed integrally together can be easily handled offering an advantage from the standpoint of producing the thin-film capacitor. Here, however, it is necessary that the connection portions 9 are so formed as will not to completely cover the terminal electrode layers 4 and 5. When the terminal electrode layers 4 or 5 are completely covered with the connection portions 9, it becomes no longer possible to provide the external terminals 7 on the terminal electrode layers 4 or 5.

Though the above-mentioned thin-film capacitor includes four capacitor elements A to D, the number of the capacitor elements may be three or more. The number of the terminal electrode layers to which the electrode layers are to be connected, increases with an increase in the number of the capacitor elements, making it possible to increase the number of the external terminals formed on the terminal electrode layers and, hence, to increase the number of division of the current path enabling the inductance to be further decreased.

Figure 4:
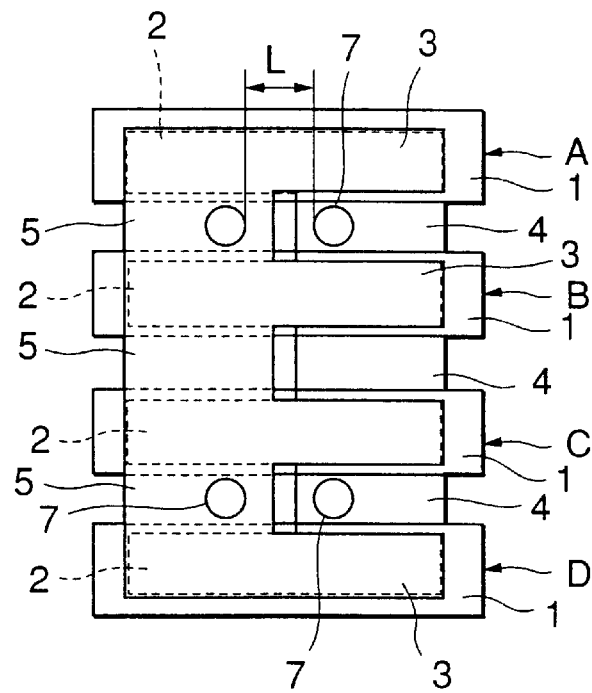
FIGS. 4 and 5 are plan views of the thin-film capacitor for explaining the positions where the external terminals are formed.
Figure 5:
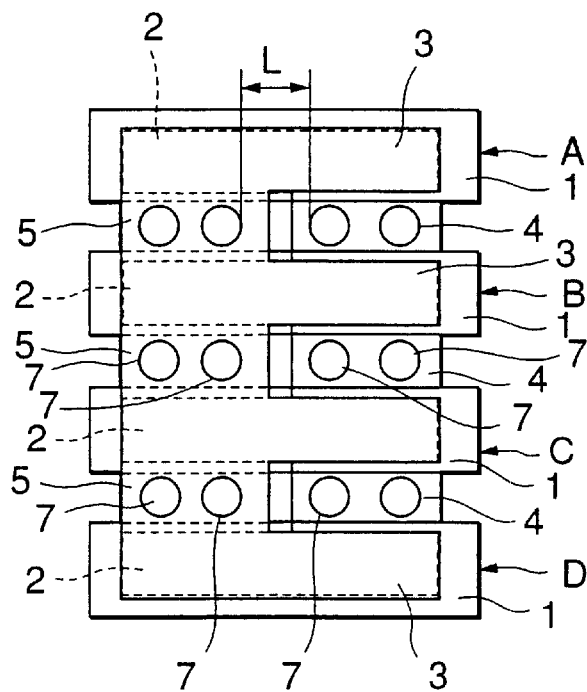

The external terminals 7 are formed on the first terminal electrode layers 4 and on the second terminal electrode layers 5, enabling the electric charge to be taken out. In the embodiment of FIG. 2, the external terminals 7 are provided on the terminal electrode layers 4 and 5 to which any one of the capacitor elements A to D is connected. However, there is no particular limitation on the number of the external terminals 7, and the external terminals 7 of any required number may be provided. In order to reliably obtain the effect of division of the current path, however, it is desired, as shown in FIG. 4, to provide at least two external terminals 7 on each of the terminal electrode layers 4 and 5. As shown in FIG. 5, furthermore, two external terminals 7 may be provided on the terminal electrode layers 4 and 5 among the capacitor elements. In this case, the capacitor can be reliably connected to the external circuit board (not shown) through the external terminals 7.

In the single-plate type thin-film capacitor of the embodiment of the present invention described above, the electrode layers 2 and 3 of the capacitor elements A to D are connected together through the terminal electrode layers 4 and 5, making it possible to divide the current path into four thereby to decrease the inductance. It is further allowed to bring the terminal electrode layers 4 and 5 formed among the capacitor elements close to each other to shorten the gap L among the external terminals 7 formed on the terminal electrode layers 4, 5. Thus, the current path is shortened to further decrease the inductance.

Figure 6:
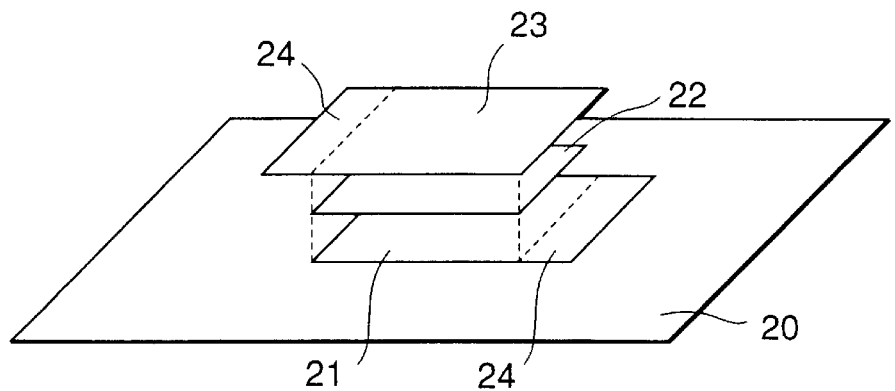
FIG. 6 is a disassembled perspective view illustrating the structure of a conventional thin-film capacitor.

For example, the conventional thin-film capacitor shown in FIG. 6 has a structure in which a first electrode layer 21, a dielectric layer 22 and a second electrode layer 23 are successively laminated on the dielectric substrate 20, the electrode layers 21 and 23 having charge take-out portions 24 formed at the ends thereof. Upon connecting the charge take-out portions 24, therefore, a plurality of thin-film capacitors can be connected in parallel. In this case, the current path can be divided into four. However, the distance increases among the charge take-out portions 24, and the effect for decreasing the inductance becomes smaller than that of the present invention.

The single-plate type thin-film capacitor of the present invention is used being provided on or inside the dielectric substrate 6. However, the external terminals used as contact to external boards are provided on the terminal electrode layers 4 and 5. Accordingly, both the external terminals 7 of the positive polarity and the external terminals 7 of the negative polarity are exposed upward. Hence, the external terminals 7 can be very easily joined to the electrodes formed, for example, on an external board, i.e., the thin-film capacitor can be very easily mounted on the external board. Further, since no dielectric layer 1 exists under the terminal electrode layers 4, 5 on which the external terminals 7 are formed, it is made possible to effectively suppress damage to the dielectric layer 1 caused by the thermal stress (difference in the thermal expansion between the terminal electrode layers 4, 5 and the dielectric layers 1) at the time of forming the external terminals 7 or mounting the capacitor to the external board.

The above-mentioned invention can be modified in a variety of ways.

Figure 7A:
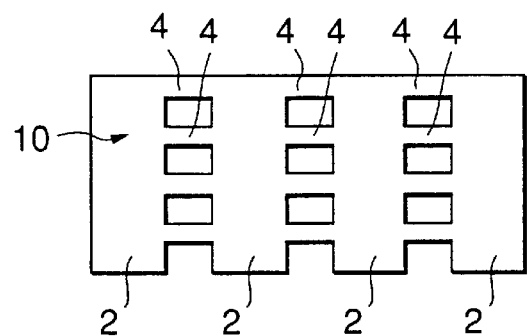
FIGS. 7a to 7c are views illustrating other shapes of the first and second electrode portions and of the dielectric layers in the thin-film capacitor according to the present invention.
Figure 7B:
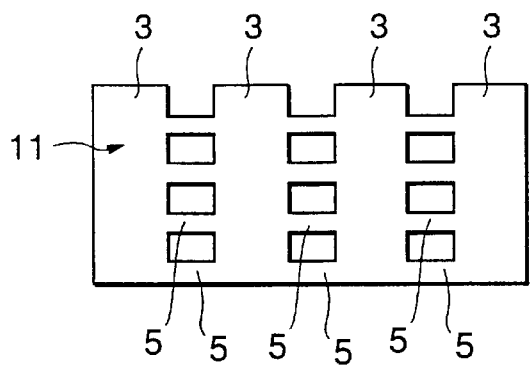
Figure 7C:
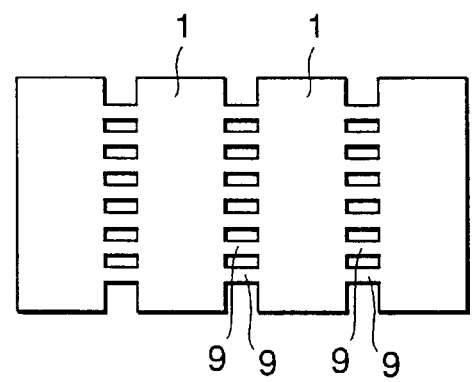
Figure 8:
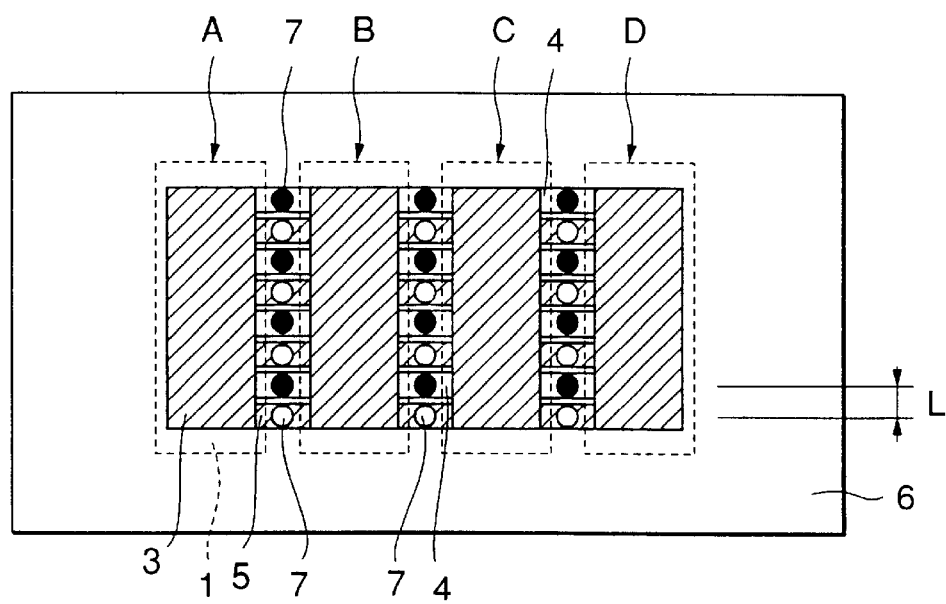
FIG. 8 is a view illustrating the plane structure of the thin-film capacitor having the first and second electrode portions of the shapes shown in FIGS. 7a and 7b.

In the above-mentioned embodiment, for example, the electrode layers 2 and 3 of the neighboring capacitor elements are connected through one terminal electrode layer 4 and one terminal electrode layer 5. These electrode layers 2 and 3, however, may be connected together through a plurality of terminal electrode layers 4 and 5. FIGS. 7a to 7c show the shapes of the first and second electrode portions 10, 11 and the dielectric layers 1 in producing the thin-film capacitor of the above-mentioned structure, and FIG. 8 is a plan view showing the structure of the above thin-film capacitor. That is, as shown in FIG. 7a, the four first electrode layers 2 in the first electrode portion 10 are connected together by the four first terminal electrode layers 4 formed maintaining a gap. As shown in FIG. 7b, furthermore, the four second electrode layers 3 in the second electrode portion 11 are connected together by the four second terminal electrode layers 5 formed maintaining a gap. The first terminal electrode layers 4 and the second terminal electrode layers 5 are arranged so they will not be overlapped one upon the other. Therefore, in the thin-film capacitor having dielectric layers 1 between these electrode portions as shown in FIG. 8, the external terminals 7 having dissimilar polarities are alternatingly arranged among the capacitor elements A to D (in FIG. 8, black circles represent external terminals 7 formed on the first terminal electrode layers 4 and open circles represent external terminals formed on the second terminal electrode layers 5). Further, as shown in FIG. 7c, the four dielectric layers 1 can be connected by a plurality of junction portions 9. Such a plurality of junction portions 9 are formed so they will not to completely cover the terminal electrode layers 4 and 5, contributing to improving insulation between the first terminal electrode layers 4 and the second terminal electrode layers 5 that have dissimilar polarities.

Figure 9A:
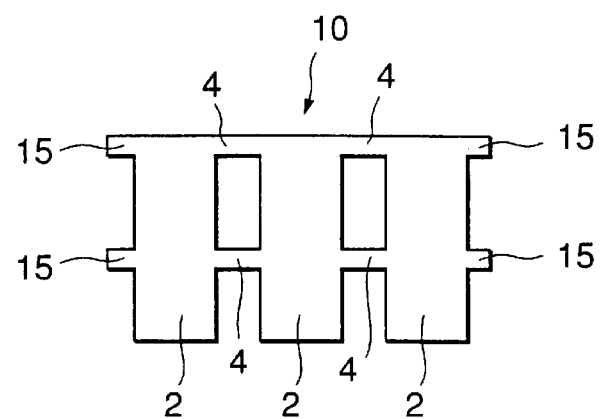
FIGS. 9a and 9b are views illustrating the shapes of the first and second electrode portions on which are formed the third and fourth terminal electrode layers.
Figure 9B:
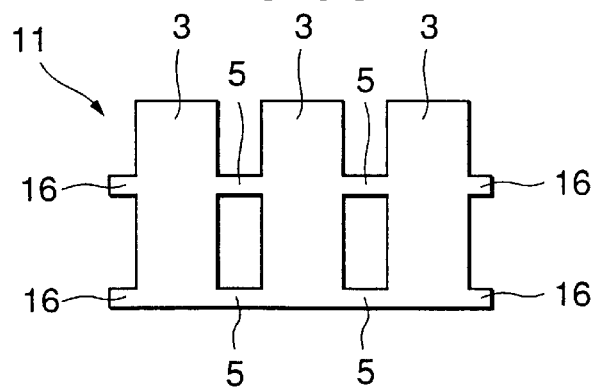
Figure 10A:
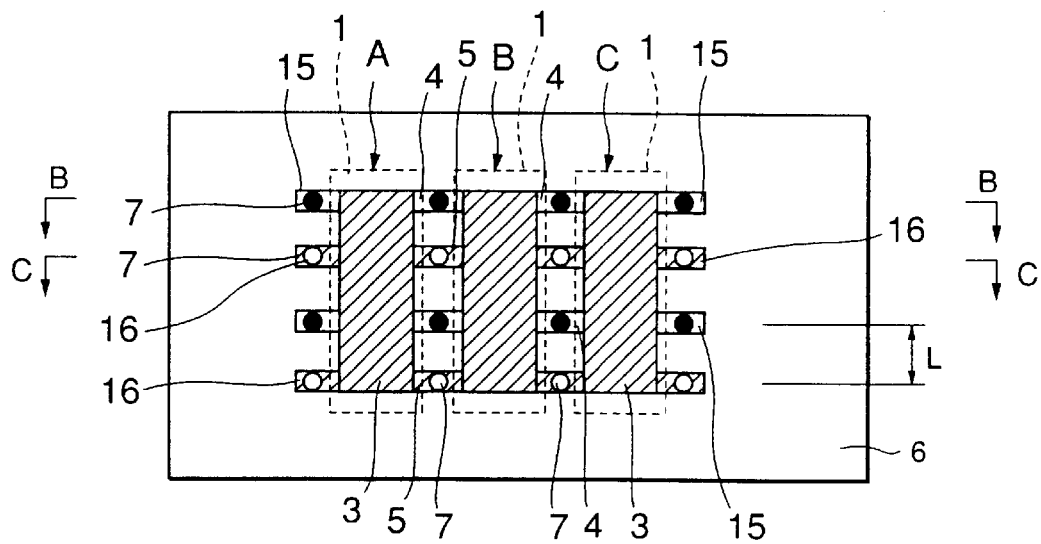
FIGS. 10a to 10c are views illustrating the plane structure and the side sectional structure of the thin-film capacitor equipped with the first and second electrode portions shown in FIGS. 9a and 9b.
Figure 10B:
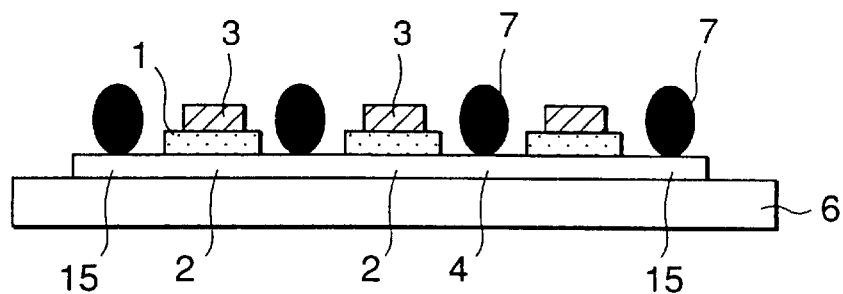
Figure 10C:
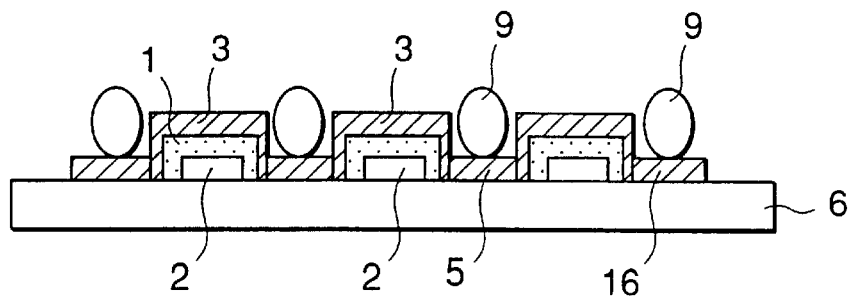

Third terminal electrode layers and fourth terminal electrode layers that are protruding outward, may be provided for the first electrode layers and the second electrode layers of capacitor elements at either end among the capacitor elements arranged side by side. FIGS. 9a and 9b illustrate the shapes of the first and second electrode portions 10 and 11 for which the third terminal electrode layers and the fourth terminal electrode layers are formed, and FIGS. 10a to 10c are a plan view and side sectional views illustrating the structure of the thin-film capacitor having such electrode portions.

In the first electrode portion 10 shown in FIG. 9a, the first electrode layers 2 at both ends are provided with the third terminal electrode layers 15 protruding outward in a direction in which the first terminal electrode layers 4 extend. In the second electrode portion 11 shown in FIG. 9b, the second electrode layers 3 at both ends are provided with the fourth terminal electrode layers 16 protruding outward in a direction in which the second terminal electrode layers 5 extend. That is, as shown in FIG. 10a, the third terminal electrode layers 15 and the fourth terminal electrode layers 16 are so formed as will not be overlapped one upon the other, and are further provided with external terminals 7. In FIGS. 10a to 10c, black circles represent external terminals 7 formed on the first terminal electrode layers 4 and on the third terminal electrode layers 15, and open circles represent external terminals 7 formed on the second terminal electrode layers 5 and on the fourth terminal electrode layers 16. As will be obvious from FIG. 10b which is a B—B cross section of the thin-film capacitor of FIG. 10a and from FIG. 10c which is a C—C cross section of the same capacitor, the first terminal electrode layers 4, third terminal electrode layers 15, second terminal electrode layers 5 and fourth terminal electrode layers 16 are all located on the same plane.

In the thin-film capacitor in which the third and fourth terminal electrode layers 15, 16 are formed, the external terminals 7 are arranged maintaining a balance on the whole thin-film capacitor. When the thin-film capacitor is mounted on an external board, in particular, both ends of the capacitor are stably secured making it possible to obtain a very stable mounting structure. In the thin-film capacitor having a plane structure as shown in FIG. 8, for example, the external terminals 7 are provided only inside the capacitor. When this capacitor is to be mounted on an external board using external terminals 7, therefore, the ends of the capacitor tends to be tilted. Besides, both ends of the capacitor lose stability. After mounting, therefore, the external terminals 7 are often broken due to mechanical vibration. In the thin-film capacitor shown in FIG. 10a, however, external terminals 7 are formed at both ends of the capacitor to effectively prevent the occurrence of such inconvenience.

Figure 11A:
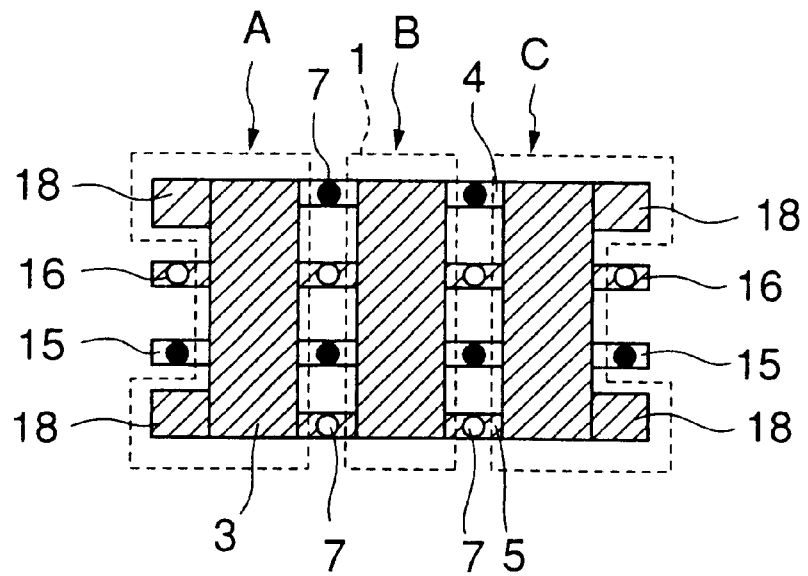
FIGS. 11a and 11b are views illustrating the plane structures of the thin-film capacitors provided with capacity addition portions.
Figure 11B:
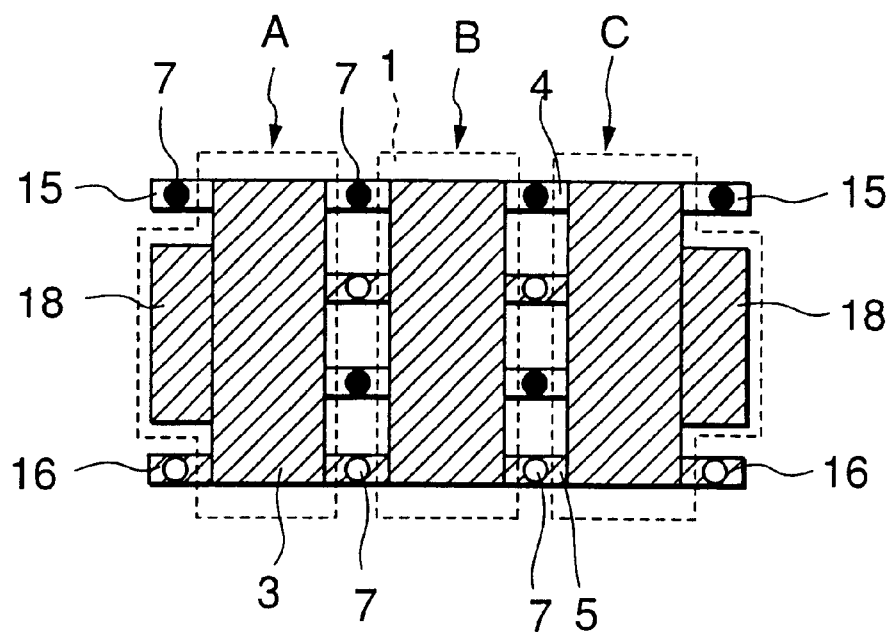

In the thin-film capacitor provided with the third and fourth terminal electrode layers 15, 16 protruding outward as described above, furthermore, capacity addition portions may be provided to increase the capacity of the capacitor. FIGS. 11a and 11b are plan views illustrating the structure of the thin-film capacitor provided with the capacity addition portions. In the thin-film capacitors shown in FIGS. 11a and 11b, the capacitor elements A and C at both ends are provided with the above-mentioned third and fourth terminal electrode layers 15 and 16, and are further provided with capacity addition portions 18 in space where the terminal electrode layers 15 and 16 are not formed. The capacity addition portions 18 are formed by outwardly extending the first electrode layers 2, dielectric layers 1 and second electrode layers 3 of the capacitor elements A and C at both ends. The length by which the capacity addition portions 18 are outwardly protruded is set to be nearly the same as the length by which the terminal electrode layers 15 and 16 are protruded, whereby the capacity of the capacitor is increased without increasing the size of the thin-film capacitor. The capacity addition portions can be provided in a plural number in the capacitor elements A and C at both ends as shown in FIG. 11a, or can be provided in a number of one in the capacitor elements A and C as shown in FIG. 11b.

Figure 12A:
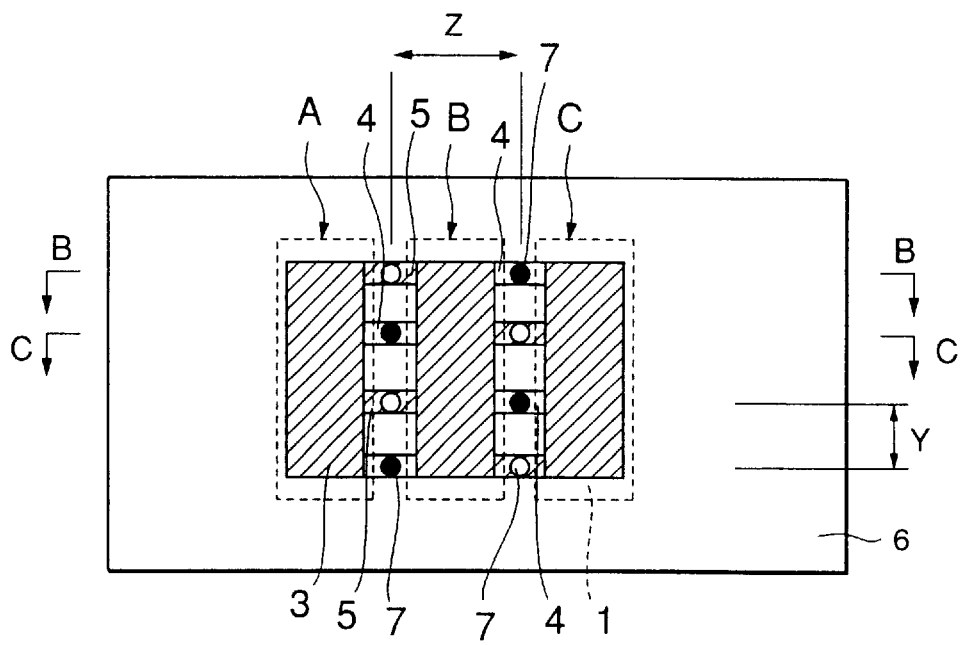
FIGS. 12a to 12c are views illustrating the plane structure and the side sectional structure of the thin-film capacitor in which the first terminal electrode layers and the second terminal electrode layers are alternatingly formed on a line.
Figure 12B:
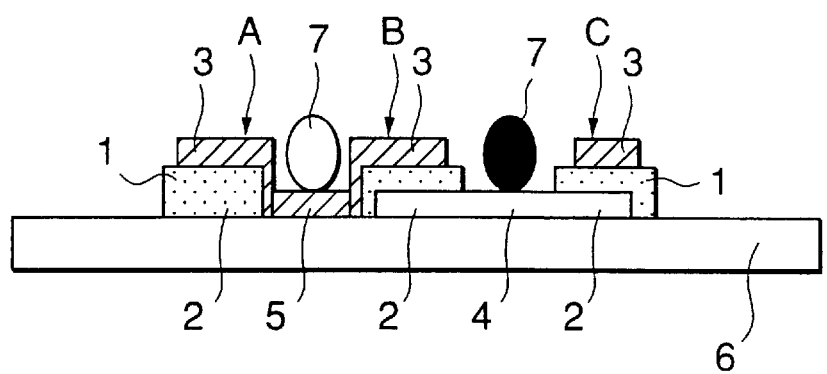
Figure 12C:
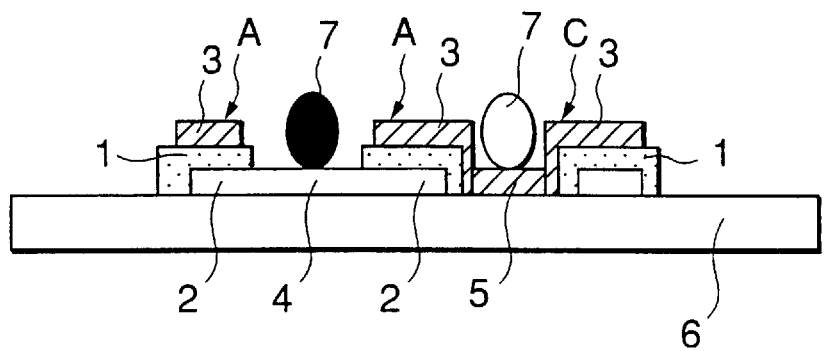
Figure 13A:
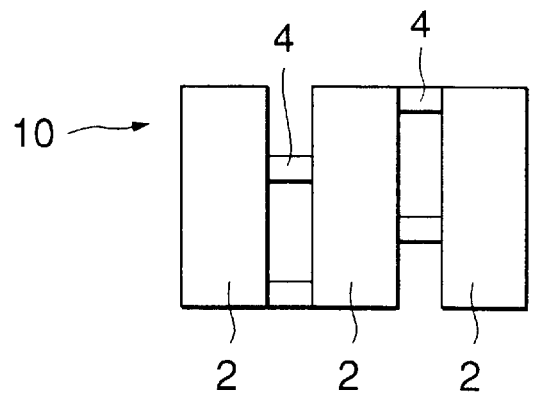
FIGS. 13a and 13b are views illustrating the shapes of the first electrode portion and the second electrode portion in the capacitor of FIGS. 12a to 12c.
Figure 13B:
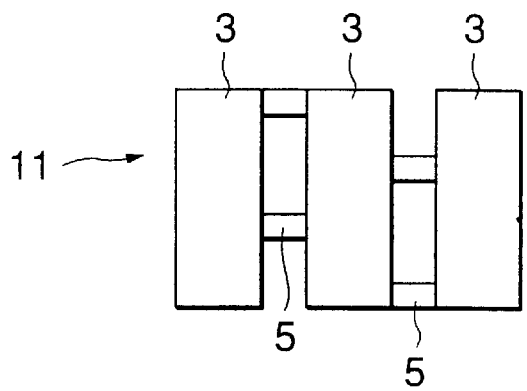

In the thin-film capacitors shown in FIGS. 1 to 11, the first terminal electrode layers 4 connecting the first electrode layers 2 together and the second terminal electrode layers 5 connecting the second electrode layers 3 together, are extending on a line as a whole, respectively. According to the present invention, however, the first terminal electrode layers 4 and the second terminal electrode layers 5 can be formed to exist alternatingly on a line in order to further decrease the inductance. FIGS. 12a to 12c are a plan view and side sectional views illustrating the structure of the thin-film capacitor in which the first terminal electrode layers 4 and the second terminal electrode layers 5 are alternatingly formed on a line, and FIGS. 13a and 13b illustrate the shapes of the first electrode portion 10 and the second electrode portion 11 of the thin-film capacitor. In these drawings, too, the external terminals 7 formed on the first terminal electrode layers 4 are represented by black circles, and the external terminals 7 formed on the second terminal electrode layers 5 are represented by white circles.

In the first electrode portion 10 of this capacitor as shown in FIG. 13a, the first terminal electrode layers 4 connected to the left side of the central first electrode layer 2 are not arranged on the same lines as the first terminal electrode layers 4 connected to the right side thereof. Similarly, in the second electrode portion 11, too, as shown in FIG. 13b, the second terminal electrode layers 5 connected to the left side of the central second electrode layer 3 are not arranged on the same lines as the second terminal electrode layers 5 connected to the right side thereof. Referring to FIG. 12a, the first terminal electrode layers 4 connected to the left side of the central capacitor element B are formed on the same lines as the second terminal electrode layers 5 connected to the right side thereof. That is, as will be understood from FIG. 12b which is the B—B cross section of the capacitor of FIG. 12a and from FIG. 12c which is the C—C cross section thereof, in the central capacitor element B, the second terminal electrode layers 5 connected to the other side of the second electrode layer 3 are opposed to the first terminal electrode layers 4 connected to the one side of the first electrode layer 2 on the same plane, and external terminals 7 are provided on these terminal electrode layers 4 and 5.

Figure 14A:
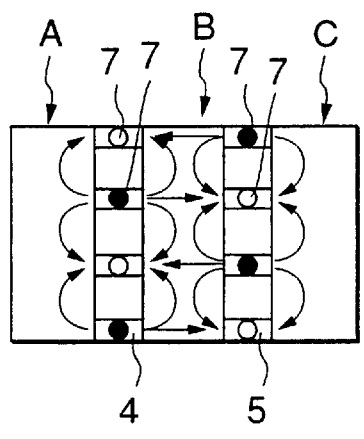
Figure 14B:
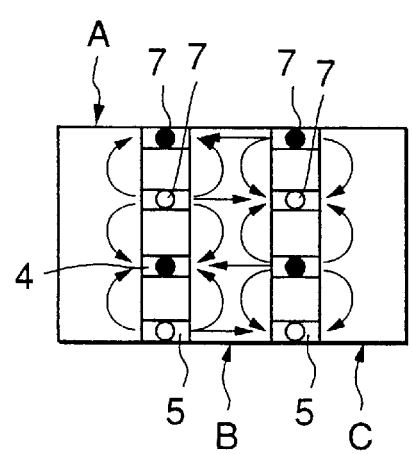
FIG. 14b is a view illustrating a current path in the capacitor in which the first terminal electrode layers and the second terminal electrode layers are formed on a line, respectively.

In the thin-film capacitor of this structure, the current path is divided into many parts and, at the same time, the magnetic fields formed by the current paths are canceled by each other contributing to further decreasing the inductance. Reference is now made to FIGS. 14a and 14b showing the current paths of the capacitor. In the capacitor in which the first terminal electrode layers 4 and the second terminal electrode layers 5 are, respectively, formed on lines (FIG. 14b), the right and left current paths indicated by arrows have the same directions if attention is given to the central capacitor element B, and the magnetic fields formed by these current paths act synergistically. In the capacitor in which the first terminal electrode layers 4 and the second terminal electrode layers 5 are alternatingly formed on lines and are opposed to each other (capacitor of FIG. 12a), the right and left current paths indicated by arrows are in the opposite directions if attention is given to the central capacitor element B, and the magnetic fields formed by these current paths are canceled, enabling the inductance to be further decreased compared to that of the capacitor of FIG. 14b. Referring to FIG. 12a, it is desired that the gaps X and Y between the neighboring two external terminals 7 having dissimilar polarities are not larger than 1.0 mm. The shorter the gaps X and Y, the larger the effect for decreasing the inductance.

When the gaps X and Y exceed 1.0 mm, the effect for decreasing the inductance decreases and, besides, the size of the capacitor increases, giving disadvantage from the standpoint of mounting.

In the foregoing were described the single-plate type thin-film capacitors. According to the present invention, however, the thin-film capacitor can be easily produced like the conventional thin-film capacitors by laminating the dielectric layers and the electrode layers but changing the shape of the electrodes of the conventional thin-film capacitor shown in FIG. 6. Therefore, the present invention can be applied not only to the single-plate thin-film capacitors but also to the laminated thin-film capacitors.

FIGS. 15a to 15d illustrate laminated thin-film capacitors according to the present invention.

Figure 15A:
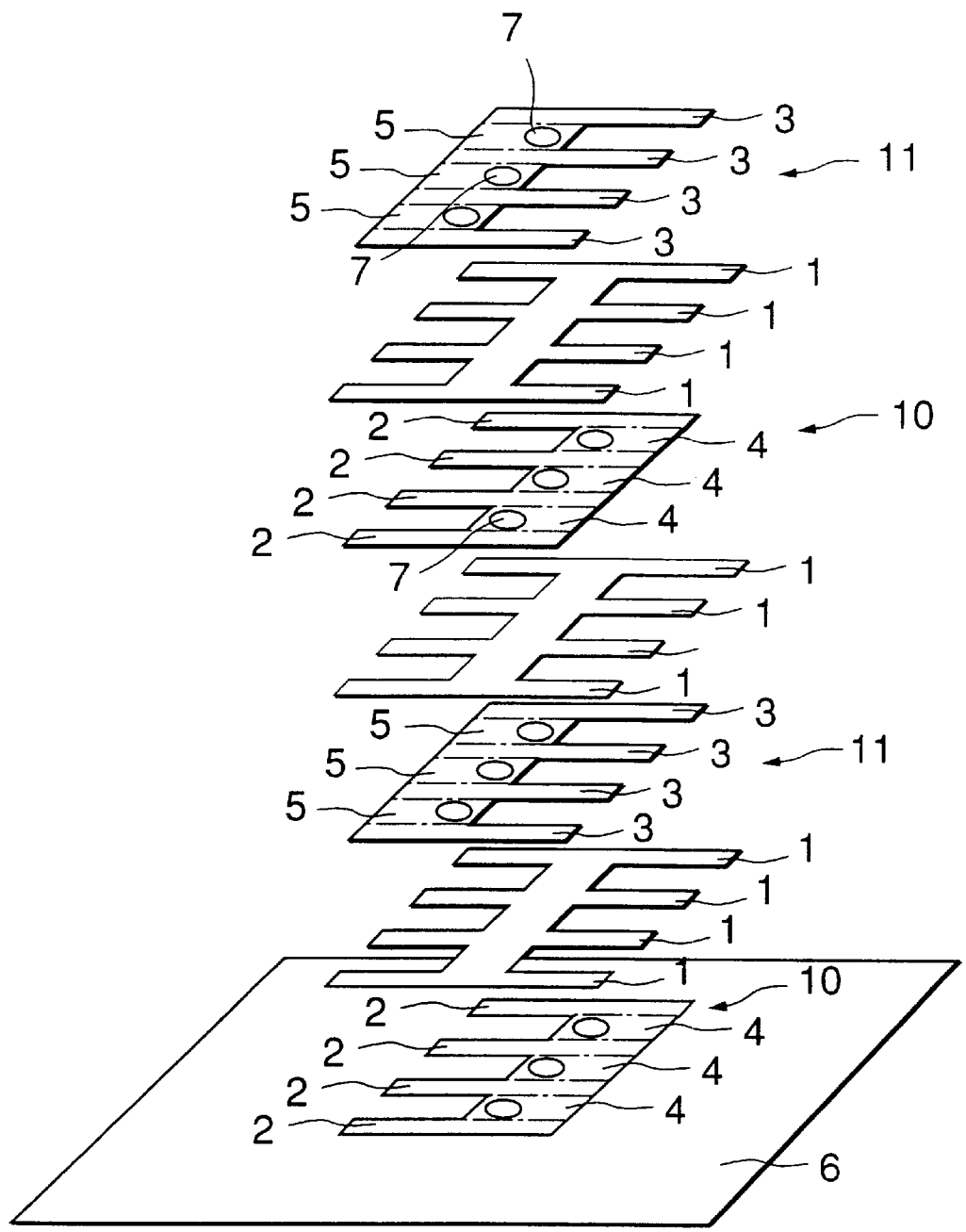
FIGS. 15a to 15d are disassembled perspective views illustrating various kinds of laminated thin-film capacitors according to the present invention.

In the capacitor of FIG. 15a, a plurality of first electrode portions 10 and a plurality of second electrode portions 11 are laminated on a dielectric substrate 6 with dielectric layers 1 interposed among them. External terminals 7 are provided on the first terminal electrode layers 4 of the first electrode portion 10 which is the uppermost layer, external terminals 7 are provided on the second terminal electrode layers 5 of the second electrode portion 11 which is the uppermost layer, and the electric charge is taken out through these external terminals 7. That is, the electrode portions 10, 11 and the dielectric layers 1 are so laminated one upon the other that the terminal electrode layers 4 of the electrode portion 10 and the terminal electrode layers 5 of the electrode portion 11 are not laminated one upon the other and that the terminal electrode layers 4 and 5 are not completely covered by the dielectric layers 1. The terminal electrode layers 4 are overlapped one upon the other to accomplish the electric conduction, and the terminal electrode layers 5 are overlapped one upon the other to accomplish the electric conduction. The dielectric layers 1 necessarily exist between the electrode layers 2 and 3 of the electrode portions 10 and 11.

The capacitor of FIG. 15a uses electrode portions 10 and 11 of shapes shown in FIGS. 3a and 3b. The capacitor of FIG. 15b uses electrode portions 10 and 11 of shapes shown in FIGS. 7a and 7b, the capacitor of FIG. 15c uses electrode portions 10 and 11 of shapes shown in FIGS. 9a and 9b, and the capacitor of FIG. 15d uses electrode portions 10 and 11 of shapes shown in FIGS. 13a and 13b. Though FIGS. 15b to 15d do not show external terminals 7, these capacitors, too, have external terminals 7 provided on the first terminal electrode layers 4 of the first electrode portion 10 of the uppermost layer and external terminals 7 provided on the second terminal electrode layers 5 of the second electrode portion 11 of the uppermost layer.

The laminated thin-film capacitor with such a multi-layer structure has a large capacity permitting the external terminals 7 to be exposed on the upper portion thereof, and can be easily mounted on an external board. The laminated thin-film capacitor is usually provided on the dielectric substrate 6 and is mounted on the external board. The laminated thin-film capacitor, however, may be provided in the dielectric substrate 6. When provided in the dielectric substrate 6, the first terminal electrode layers 4 may be connected together and the second terminal electrode layers 5 may be connected together using, for example, through-hole conductors. The external terminals 7 may be formed by the through-hole conductors.

In the present invention, the thicknesses and sizes of the dielectric layers 1 and the electrode layers 2, 3 can be suitably changed depending upon the materials and applications in which the capacitor is used. Generally, however, it is desired that the thicknesses are from about 0.1 to about 1 $\mu$m, the dielectric layers 1 and the electrode layers 2, 3 constituting one capacitor element have a side of from about 0.1 to about 3 mm, and the gap is not larger than 1 mm among the neighboring external terminals 7 having dissimilar polarities.

Thin films of gold (Au), platinum (Pt), palladium (Pd), copper (Cu), silver (Ag), nickel (Ni), titanium (Ti) or chromium (Cr) and the like is used as electrode layers 2, 3 and as terminal electrode layers 4, 5. Among them, however, a thin film of gold or platinum which is little reactive with the dielectric layers 1 and are not oxidized or a thin film of copper having a low resistance is best suited.

Though there is no particular limitation, the material forming the external terminals 7 will be, generally, solder, Pb, Sn, Ag, Au, Cu, Pt, Al, Ni or various kinds of electrically conducting resins. Though there is no particular limitation on their shapes, the external terminals 7 will be in the form of bumps, foils, lines or paste.

As the dielectric substrate 6 for supporting the thin-film capacitor, there can be preferably used alumina, sapphire, single crystal of MgO, single crystal of $SrTiO_3$, silicon coated with $SiO_2$, or glass. From the standpoint of small reactivity with the electrode layers and crystallinity of the dielectric layers or the electrode layers, it is most desired to use alumina or silicon coated with $SiO_2$.

It is desired that the dielectric layer 1 is a thin film having a thickness of not larger than 1 μm. The dielectric layer may be made of any known dielectric material provided it has a high dielectric constant in the high-frequency regions, such as composite perovskite oxide containing two or more kinds of metals, PZT, PLZT, $SrTiO_3$, or $Ta_2O_5$, and can be formed by any known method such as PVD method, CVD method or sol-gel method. It is particularly desired that the dielectric layer is a thin film having a dielectric constant capacity of not smaller than 1000 at a frequency of 300 MHz (at room temperature).

In the present invention, it is most desired that the dielectric layer 1 comprises perovskite crystal particles containing Pb, Mg, Nb, Ti and Zr as metal elements and pyrochlore crystal particles, and that the portions A where the perovskite existence factor is not smaller than 90% in the direction of thickness of the dielectric layer 1 is existing at a ratio of from 50 to 90% in the whole dielectric layer. Referring to FIG. 16 illustrating the sectional structure of the dielectric layer 1, the dielectric layer 1 comprises coarse perovskite crystal particles 21 (e.g., not smaller than 0.3 μm) and fine pyrochlore crystal particles 22 (e.g., not larger than 0.03 μm) existing in the grain boundaries of the crystal particles 21.

It has been known that the perovskite composite oxide containing two or more kinds of metals and, particularly, $Pb(Mg_{1/3}Nb_{2/3})O_3$ (hereinafter referred to as PMN) exhibits a large dielectric constant at room temperature, but easily forms, at low temperatures, stable pyrochlore crystals that exhibit a low dielectric constant capacity. Therefore, the perovskite composite oxide such as PMN is not suited as a material for the capacitors. In recent years, there has been developed a dielectric film comprising a perovskite single phase involving, however, problems in that it is difficult to decrease the thickness of the film to be smaller than 1 μm and durability is poor (insulating property deteriorates within short periods of time). Upon forming the dielectric layer 1 comprising the perovskite composite oxide having a sectional structure as shown in FIG. 16, however, it is possible to obtain a thin-film capacitor having a very large capacity. That is, in the capacitor of the structure in which the dielectric layers 1 shown in FIG. 16 are sandwiched between the first electrode layers 2 and the second electrode layers 3, the capacitor portions (charge-generating regions) comprising the coupling bodies 35 in which the perovskite crystal particles 21 are coupled together toward the electrode layers 2, 3, are connected in parallel with the capacitor portions (charge-generating regions) comprising the pyrochlore crystal particles 22 among the plurality of coupling bodies 35. Despite possessing pyrochlore crystal particles 22 having a low dielectric constant, therefore, the capacitor portion comprising the perovskite crystal particles 21 exhibits a high dielectric constant. Therefore, the dielectric layers 1 as a whole exhibit a high dielectric constant capacity making it possible to obtain a thin-film capacitor having a large capacity.

The portions A where the existence factor of the perovskite crystal particles 21 is not smaller than 90% in the direction of thickness are found from a curve shown in FIG. 17b that is formed by inputting a photograph of a sectional view of the dielectric layer shown in FIG. 17a into a personal computer by using an image scanner, calculating the number of the pixels corresponding to the crystal particles 21, and dividing the number of the pixels by the total number of the pixels in the direction of the thickness of the film.

In order to form a structure in which the perovskite crystal particles and the pyrochlore crystal particles are arranged in parallel in the dielectric layer 1, therefore, it becomes necessary that the portions A where the existence factor of the perovskite crystal particles 21 is not smaller than 90% in the direction of the thickness, exist at a ratio of from 50 to 90% in the whole surface of the dielectric layer. When the perovskite crystal particles 21 have a small particle diameter or when the amount of the portions A is smaller than 50%, the effect of the pyrochlore crystal particles 22 having a low dielectric constant becomes conspicuous, whereby the dielectric layers 1 as a whole exhibit a low dielectric constant capacity, and the thin-film capacitor having a large capacity is not obtained. When the phase of the perovskite crystal particles 21 (the portions A) exceeds 90%, on the other hand, the dielectric layers 1 lose insulating property.

As shown in FIG. 18, furthermore, a single peroviskite crystal particle 31 can be made present between the upper and lower electrode layers 2 and 3. That is, with the pyrochlore crystal particles 32 present among the perovskite crystal particles 31, a parallel connection is reliably formed making it possible to further increase the dielectric constant capacity of the dielectric layer 1.

It is desired that the coarse perovskite crystal particles 21, 31 have a molar composition of metal elements as represented by the following formula (1):

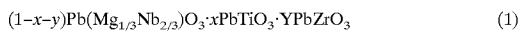

$$(1-x-y)Pb(Mg_{1/3}Nb_{2/3})O_3 \cdot xPbTiO_3 \cdot YPbZrO_3 \qquad (1)$$

wherein x and y are numbers satisfying,
$0 < x \leq 0.10$ and, particularly, $0 < x \leq 0.05$,
$0 < y \leq 0.20$ and, particularly, $0 < y \leq 0.10$.

That is, when the value x representing the amount of the $PbTiO_3$ component is larger than the above-mentioned range, the particle diameter of the perovskite crystal particles becomes smaller than, for example, 0.3 μm, and the dielectric layers 1 exhibit a small dielectric constant capacity. When the value y representing the amount of the $PbZrO_3$ is larger than the above-mentioned range, the diameter of the perovskite crystal particles becomes small, and the dielectric layers 1 exhibit a small dielectric constant capacity. When the value x or the value y is 0, the perovskite crystal particles containing Pb, Mg, Nb, Ti and Zr are not obtained, and the dielectric layers 1 exhibit a small dielectric constant capacity. Upon setting the values x and y to lie within the above-mentioned ranges, it is possible to obtain the dielectric layers 1 exhibiting a dielectric constant capacity of not smaller than 2500 and, particularly, not smaller than 2800.

In order to form the dielectric layers 1 of the above-mentioned molar composition, therefore, a precursor solution is prepared in which organometal compounds of Pb, Mg, Nb, Ti and Zr are homogeneously dissolved at predetermined ratios, and is applied onto a predetermined substrate to form a film thereon.

Concretely speaking, an Mg compound and an Nb compound, which are at least one selected from organic acid salts of Mg or Nb, inorganic salts or alkoxides thereof, are mixed at a molar ratio of Mg:Nb=b:2 ($1.00 \leq b \leq 1.15$) in a solvent represented by R1OH, $R2OC_2H_4OH$ or R3COOH (R1, R2, R3: alkyl groups having 1 or more carbon atoms). After mixing, a predetermined operation is conducted to synthesize MgNb composite alkoxide molecules that exhibit absorption near 656 $cm^{-1}$ in the IR spectrum and have a stable Mg—O—Nb bond even in the presence of other nucleophilic organic metal compounds.

The following method can be employed to obtain MgNb composite alkoxide molecules having absorption near 656 $cm^{-1}$ in the IR spectrum.

According to a first method, the starting alkoxides of Mg and Nb are mixed into a solvent of which the temperature is then elevated up to its boiling point. Then, the solvent is refluxed in the presence of a catalyst such as an acid, to promote the de-etherification reaction in the molecules.

According to a second method, the starting alkoxides of Mg and Nb are mixed into a solvent of which the temperature is then elevated up to its boiling point as described above. Then, the solvent is refluxed to promote the reaction followed by the addition of a stabilizer as represented by acetic anhydride, ethanolamine or acetylacetone.

According to a third method, a carboxylate of Mg and an alkoxide of Nb are refluxed to promote the de-esterification reaction in the molecules.

According to a fourth method, a hydroxide of Mg and an alkoxide of Nb are refluxed, or an alkoxide of Mg and a hydroxide of Nb are refluxed, to promote the alcohol-removing reaction in the molecules.

According to a fifth method, the above-mentioned stabilizer such as acetic anhydride, ethanolamine or acetylacetone is added to decrease the nucleophilic property of the lead precursor.

By using any one of the above-mentioned methods, it is possible to synthesize MgNb composite alkoxide molecules having a stable Mg—O—Nb bond even in the presence of other nucleophilic organometal compounds. Among them, it is most desired to employ the second method of adding a stabilizer after the refluxing operation.

Further, a mixture of water and a solvent is added dropwise to the thus synthesized MgNb composite alkoxide solution to execute a partial hydrolysis, thereby to form an MgNb sol in which the above-mentioned MgNb composite alkoxide is polycondensed. The partial hydrolysis represents a method in which the alkoxyl groups in the molecules are partly substituted by hydroxyl groups to effect the polycondensation based on the dehydrogenation reaction or the alcohol-removing reaction in the substituted molecules.

Next, at least one kind of lead compound selected from an organic acid salt of lead (Pb), inorganic salt or alkoxide thereof is mixed into a solvent represented by R1OH, R2OC$_2$H$_4$OH, R3COOH (R1, R2, R3: alkyl groups having one or more carbon atoms). When the lead compound contains water of crystallization, the dehydrogenation treatment is executed so that no water is present in the Pb precursor solution that is prepared.

The Pb precursor solution that is prepared and the MgNb composite alkoxide solution or the MgNb sol are mixed together at a molar ratio of Pb:(Mg+Nb)=a:(b+2)/3 (1.00≦a≦a 1.15, 1.00≦b≦1.15) to prepare a PMN precursor solution.

After one kind of Ti compound selected from an organic acid salt of Ti or alkoxide thereof, and the above-mentioned Pb precursor solution are mixed together at a molar ratio of Pb:Ti=a:1 (1.00≦a≦1.15), the refluxing operation is conducted to synthesize a PT precursor solution.

Similarly, a Zr compound selected from an organic acid salt of Zr or alkoxide thereof, and the above-mentioned Pb precursor solution are mixed at a molar ratio of Pb:Zr=a:1 (1.00≦a≦1.15) and, then, the refluxing operation is conducted to synthesize a PZ precursor solution.

The above-mentioned PMN precursor solution, PT precursor solution and PZ precursor solution are mixed together at a molar ratio of PMN:PT:PZ=(1−x−y):x:y thereby to prepare a (1−x−y)PMN−xPT−yPZ precursor solution.

Or, a Ti compound selected from an organic acid salt of Ti or an alkoxide thereof is mixed into a solvent represented by R1OH, R2OC$_2$H$_4$OH, R3COOH (R1, R2, R3: alkyl groups having 1 or more carbon atoms) to prepare a Ti solution. Similarly, a Zr solution is prepared. The thus prepared Ti solution and Zr solution are mixed into an MgNb composite alkoxide solution or an MgNb sol and, then, a chelating agent such as acetylacetone is added thereto in an amount of not smaller than 0.5 times of the amount of metals in the MgNb solution.

The mixture is then mixed into the Pb precursor solution or an organic acid salt of lead (Pb) such as lead acetate-trihydrate to prepare a (1−x−y)PMN−xPT−yPZ precursor solution.

The thus prepared coating solution is applied onto the substrate by the spin-coating method, dip-coating method or spray method to form a film thereof.

After the film is formed, the heat-treatment is effected at a temperature of from 360 to 400° C. for one minute to burn organic matters remaining in the film thereby to obtain a gel film. It is desired that the thickness of the film formed by one time of operation is not larger than 0.1 μm. After the formation of film and heat treatment are repeated until a predetermined film thickness is obtained, firing is conducted at 820 to 860° C. to obtain a thin crystalline dielectric film contemplated by the present invention.

In particular, in order to form a predetermined amount of pyrochlore type crystal particles comprising a composite oxide containing Pb, Mg, Nb, Ti and Zr as metal elements according to the present invention, the heat treatment must be conducted at 360 to 400° C. and, particularly, at 375 to 385° C., and the firing must be conducted at 820 to 860° C. and, particularly, at 840 to 850° C.

EXAMPLES

Example 1

The electrode layers, terminal electrode layers and dielectric layers were all formed by using a radio-frequency magnetron sputtering method. An argon gas was introduced as a sputtering gas into the process chamber, and the pressure was maintained at 6.7 Pa by evacuation.

A substrate holder and three target holders were installed in the process chamber so that three kinds of target materials could be sputtered. To effect the sputtering, the substrate holder was moved to a target position of the material with which the film was to be formed, and the distance between the substrate and the target was maintained to be 60 mm.

A radio-frequency power with 13.56 MHz was applied across the substrate holder and the target from an external radio-frequency power source, and a plasma of a high density was formed near the target by utilizing the magnetron magnetic field formed by a permanent magnet installed on the back surface of the target to sputter the surface of the target.

The radio-frequency voltage could be applied to the three targets independently. The substrate holder possessed a heating mechanism based on a heater, and the substrate temperature was controlled to remain constant during the formation of the film by sputtering.

Three kinds of metal masks having a thickness of 0.10 mm were installed on the substrate placed on the substrate holder on the side of the target, so that a required mask could be set onto the film-forming surface of the substrate depending upon the film-forming pattern.

First, a comb-type electrode (first electrode portion 10) having first electrode layers that are connected together through the terminal electrode layers as shown in FIG. 3(*a*) was integrally formed on a substrate of a 0.25 mm-thick alumina sintered product by the sputtering from the Pt target through a first mask pattern and, then, dielectric layers shown in FIG. 3(c) were formed by using a sintered product of $Pb(Mg_{1/3}Nb_{2/3})O_3$ as a target through a second mask pattern under the conditions of a substrate temperature of 535° C. and a high-frequency electric power of 200 watts.

Next, a comb-type electrode (second electrode portion 11) having the second electrode layers that are connected together through the terminal electrode layers as shown in FIG. 3(b) was integrally formed by the sputtering from the Pt target through a third mask pattern. The total areas of the first electrode layers and of the second electrode layers were 0.8 mm$^2$, respectively.

Solder bumps were formed on the terminal electrode layers of the thus fabricated single-plate thin-film capacitor, and the capacitor was mounted on a board for evaluation. The solder bumps possessed a diameter of 0.1 mm and were formed in a number of three on each of the terminal electrode layers, thereby to prepare a thin-film capacitor as shown in FIGS. 1 and 2. The gap L among the solder bumps was 0.5 mm.

The impedance characteristics at 1 MHz through up to 1.8 GHz were evaluated by using an impedance analyzer (HP4291A manufactured by Hewlett-Packard Co.) to find that a capacity component was 17.5 nF and an inductance component was 80 pH. After the above-mentioned measurement was taken, the cross section of the thin-film capacitor was observed through a SEM to find that the dielectric layers possessed a thickness of 0.4 µm.

As a Comparative Example, a capacitor was prepared in the same manner as described above by setting the areas of the electrode layers to be same as described above but employing the structure of a conventional general capacitor as shown in FIG. 6, and was measured for its capacity component and the inductance component. The capacity component was 17.6 nF and the inductance component was 380 pH.

Example 2

A thin-film capacitor, as shown in FIG. 15a, having ten dielectric layers was prepared in quite the same manner as in Example 1, and was evaluated by quite the same method as that of Example 1 to find that a capacity component was 176 nF and an inductance component was 80 pH. After the above-mentioned measurement was taken, the cross section of the thin-film capacitor was observed through the SEM to find that the dielectric layers possessed a thickness of 0.4 µm.

Example 3

The substrate material, electrode material, method of forming the electrodes, shapes thereof and sizes thereof were quite the same as those of Example 1, but the dielectric layers only were formed by the sol-gel method according to the procedure described below.

A magnesium acetate and a niobium ethoxide were weighed at a molar ratio of 1:2, and were refluxed in 2-methoxyethanol (at 124° C. for 24 hours) to synthesize an MgNb composite alkoxide solution (Mg=4.95 mmols, Nb=10.05 mmols, 2-methoxyethanol=150 mmols). Next, 15 mmols of a lead acetate (anhydride) and 150 mmols of the 2-methoxyethanol were mixed together, and the distillation operation was conducted at 120° C. to synthesize a Pb precursor solution.

The MgNb precursor solution and the Pb precursor solution were mixed together at a molar ratio of Pb:(Mg+Nb)= 1:1, and the mixture was sufficiently stirred at room temperature to synthesize a $Pb(Mg_{1/3}Nb_{2/3})O_3$ (PMN) precursor solution.

The solution was diluted with the 2-methoxyethanol into about 3 times to prepare a coating solution. Next, the coating solution was applied by a spin coater onto the electrode layers, dried, and was heat-treated at 300° C. for one minute to prepare a gel film. Application of the coating solution and the heat treatment were repeated. Then, the firing was conducted at 830° C. for one minute (in the open air) to obtain a thin $Pb(Mg_{1/3}Nb_{2/3})O_3$ film.

The thus obtained dielectric thin film was coated with a resist and was exposed to light and developed through a step of photolithography. By using this as a mask, the wet etching was conducted to form the dielectric films in the same pattern as that of Example 1, to obtain a thin-film capacitor same as that of Example 1.

The thus prepared thin-film capacitor was mounted on the board for evaluation in the same manner as in Example 1, and the impedance characteristics at 1 MHz through up to 1.8 GHz were measured by using an impedance analyzer (HP4291A manufactured by Heulet-Puckered Co.) to find that a capacity component was 42.5 nF and an inductance component was 80 pH. After the above-mentioned measurement was taken, the cross section of the thin-film capacitor was observed through the SEM to find that the dielectric layers possessed a thickness of 0.5 µm.

Example 4

A single-plate thin-film capacitor as shown in FIG. 8 was prepared (effective electrode area=1.2 mm$^2$) in the same manner as in Example 1 but using as the electrode material and forming the electrode layers of a shape shown in FIG. 7a as the first electrode portion 10 and forming the electrode layers of a shape shown in FIG. 7b as the second electrode portion 11.

Solder bumps were formed on the terminal electrode layers of the thus fabricated single-plate thin-film capacitor, and the capacitor was mounted on the board for evaluation. The solder bumps possessed a diameter of 0.1 mm and were formed in a total number of 24 on the terminal electrode layers. The gap L among the solder bumps was 0.15 mm.

The impedance characteristics at 1 MHz through up to 1.8 GHz were evaluated by using an impedance analyzer (HP4291A manufactured by Hewlett-Packard Co.) to find that a capacity component was 21.2 nF and an inductance component was 3 pH. After the above-mentioned measurement was taken, the cross section of the thin-film capacitor was observed through the SEM to find that the dielectric layers possessed a thickness of 0.5 µm.

Example 5

Figure 15B:
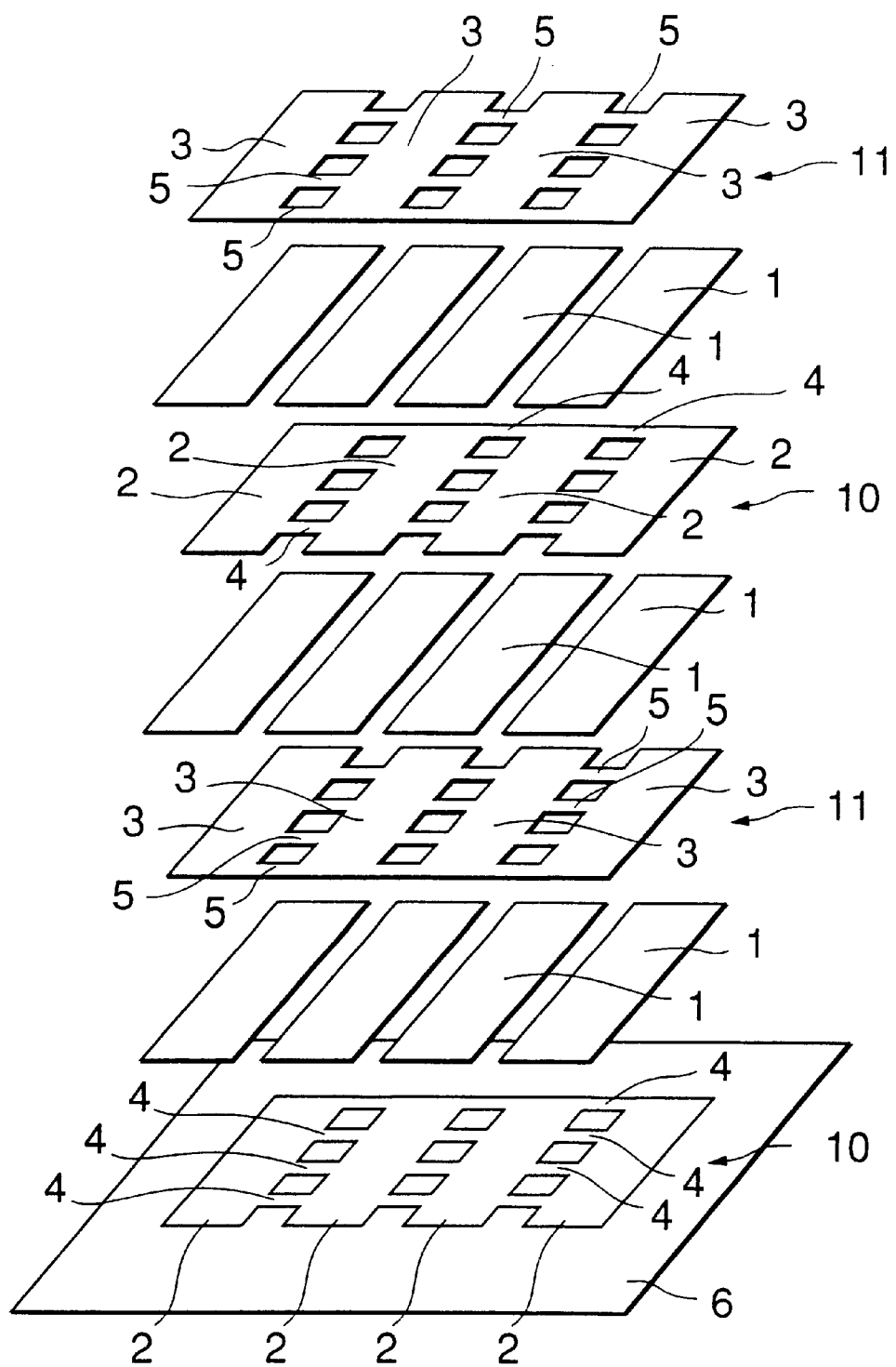

A laminated thin-film capacitor, as shown in FIG. 15b, having five dielectric layers was prepared in quite the same manner as in Example 4, and was evaluated by quite the same method as that of Example 4 to find that a capacity component was 102 nF and an inductance component was 3 pH. After the above-mentioned measurement was taken, the cross section of the thin-film capacitor was observed through the SEM to find that the dielectric layers possessed a thickness of 0.5 µm.

Example 6

A single-plate thin-film capacitor having quite the same shape and structure as those of Example 4 was prepared but forming the dielectric layers by the same method as that of Example 3, and was evaluated in the same manner as in Example 4. A capacity component was 53 nF and an inductance component was 3 pH. After the above-mentioned measurement was taken, the cross section of the thin-film capacitor was observed through the SEM to find that the dielectric layers possessed a thickness of 0.6 μm.

Example 7

A thin-film capacitor was prepared in quite the same manner as in Example 6, the solder bumps were formed on the four terminal electrode layers which exist, respectively, in each central portion aming A-B, B-C and C-D of the capacitor elements (the total number of solder bumps=12), and the capacitor was evaluated by the same method as that of Example 1. A capacity component was 52 nF and an inductance component was 7 pH. After the above-mentioned measurement was taken, the cross section of the thin-film capacitor was observed through the SEM to find that the dielectric layers possessed a thickness of 0.6 μm.

Example 8

A thin-film capacitor shown in FIG. 8 was prepared in quite the same manner as in Example 6 but selecting the number of the capacitor elements to be three. The total area of the effective electrodes of the capacitor was 0.9 mm$^2$. The solder bumps were formed in a total number of 16 on the terminal electrode layers, and the capacitor was evaluated by the same method as that of Example 1 to find that a capacity component was 40 nF and an inductance component was 4 pH. After the above-mentioned measurement was taken, the cross section of the thin-film capacitor was observed through the SEM to find that the dielectric layers possessed a thickness of 0.6 μm.

Example 9

A thin-film capacitor was prepared in quite the same manner as in Example 6 but selecting the number of the terminal electrodes to be four between the neighboring capacitor elements and setting the gap L among the solder bumps to be 0.30 mm. The solder bumps were formed in a total number of 12 on the terminal electrode layers, and the capacitor was evaluated by the same method as that of Example 1 to find that a capacity component was 53 nF and an inductance component was 11 pH. After the above-mentioned measurement was taken, the cross section of the thin-film capacitor was observed through the SEM to find that the dielectric layers possessed a thickness of 0.6 μm.

Example 10

A single-plate thin-film capacitor (effective electrode area of capacitor=0.84 mm$^2$) as shown in FIG. 10 was prepared in the same manner as in Example 4 but forming the electrode layers of shapes shown in FIGS. 9a and 9b, and a total of 16 solder bumps (diameter of 0.07 mm) were formed on the terminal electrode layers to mount the capacitor on the board for evaluation. The gap L among the solder bumps was 0.4 mm. The capacitor was evaluated in the same manner as in Example 1 to find that a capacity component was 12.4 nF and an inductance component was 13 pH. After the above-mentioned measurement was taken, the cross section of the thin-film capacitor was observed through the SEM to find that the dielectric layers possessed a thickness of 0.6 μm.

Example 11

Figure 15C:
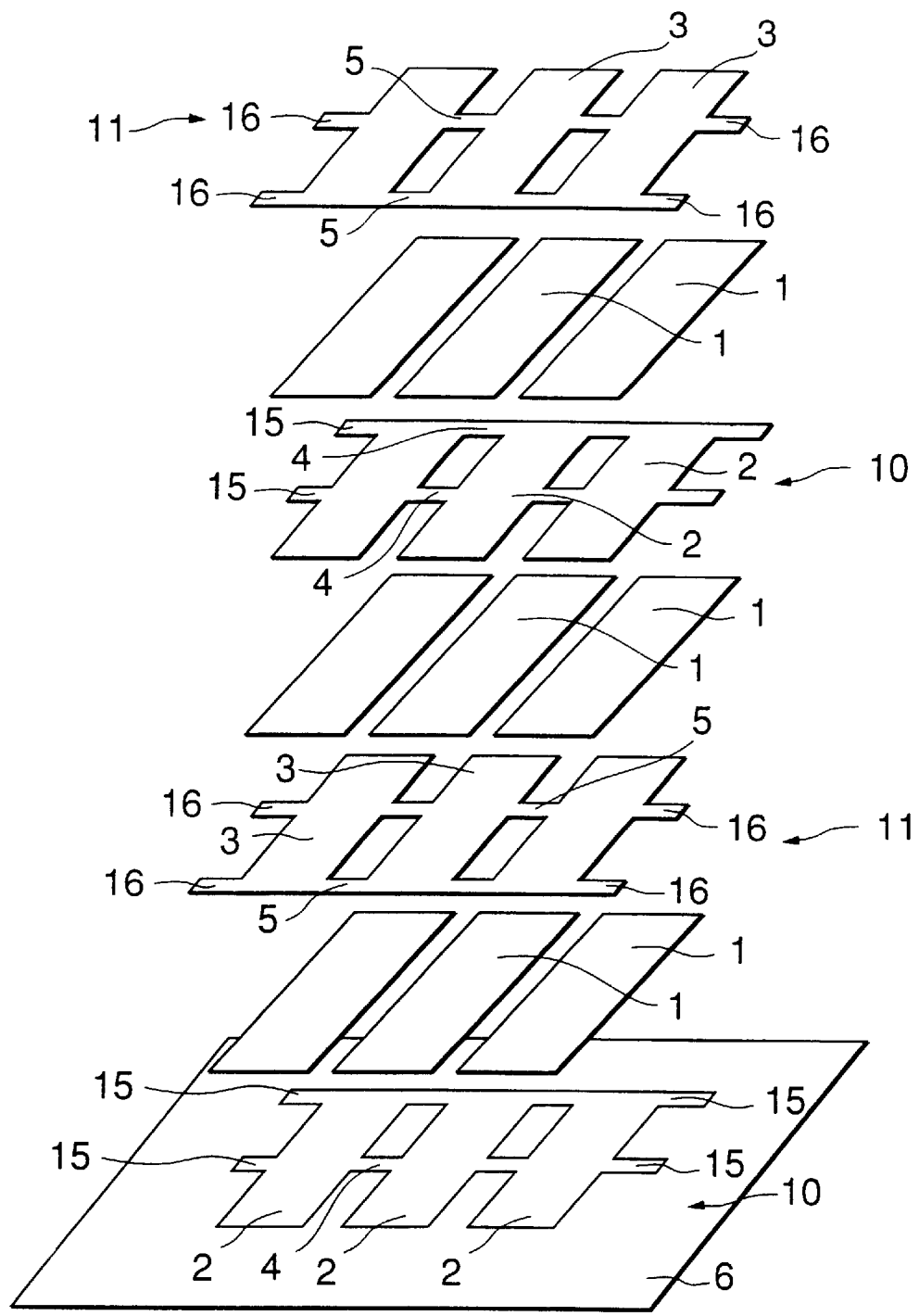

A laminated thin-film capacitor, as shown in FIG. 15c, having eight dielectric layers was prepared in quite the same manner as in Example 10, and was evaluated by quite the same method as that of Example 1 to find that a capacity component was 100 nF and an inductance component was 13 pH. After the above-mentioned measurement was taken, the cross section of the thin-film capacitor was observed through the SEM to find that the dielectric layers possessed a thickness of 0.6 μm.

Example 12

A single-plate thin-film capacitor having quite the same shape and structure as those of Example 10 was prepared but forming the dielectric layers in the same manner as in Example 3, and 16 solder bumps were formed on the terminal electrode layers in the same manner as in Example 10 to evaluate the capacitor.

A capacity component was 37 nF and an inductance component was 13 pH. After the above-mentioned measurement was taken, the cross section of the thin-film capacitor was observed through the SEM to find that the dielectric layers possessed a thickness of 0.6 μm.

Example 13

A thin-film capacitor (having an effective electrode area of 1.2 mm$^2$ and 12 solder bumps) of a structure shown in FIG. 11a was prepared according to the same method as in Example 12 by changing the shapes of the electrode layers and the dielectric layers and forming the capacity addition portions, and was evaluated. A capacity component was 52 nF and an inductance component was 15 pH. Observation through the SEM indicated that the dielectric layers possessed a thickness of 0.6 μm.

Example 14

A thin-film capacitor (having an effective electrode area of 1.2 mm$^2$ and 12 solder bumps) of a structure shown in FIG. 11b having capacitor addition portions was prepared in the same manner as in Example 12, and was evaluated. A capacity component was 53 nF and an inductance component was 18 pH. Observation through the SEM indicated that the dielectric layers possessed a thickness of 0.6 μm.

Example 15

A single-plate thin-film capacitor (number of solder bumps=8, gaps X, Y among the solder bumps=0.5 mm) having a structure shown in FIG. 12a and current paths shown in FIG. 14a was prepared in the same manner as in Example 4 but changing the electrode layers into a shape shown in FIGS. 13a and 13b, and was evaluated. A capacity component was 17.7 nF and an inductance component was 17 pH. Observation through the SEM indicated that the dielectric layers possessed a thickness of 0.5 μm.

For the purpose of comparison, a single-plate thin-film capacitor having current paths shown in FIG. 14b was prepared in the same manner as described above while changing the shape of the electrode layers, and was evaluated. A capacity component was 17.6 nF and an inductance component was 27 pH. Observation through the SEM indicated that the dielectric layers possessed a thickness of 0.5 μm.

From the above results, it was learned that the inductance component could be decreased by 10 pH (37%) by changing the positions of the terminal electrode layers from those shown in FIG. 14b to those shown in FIG. 14a.

Example 16

Figure 15D:
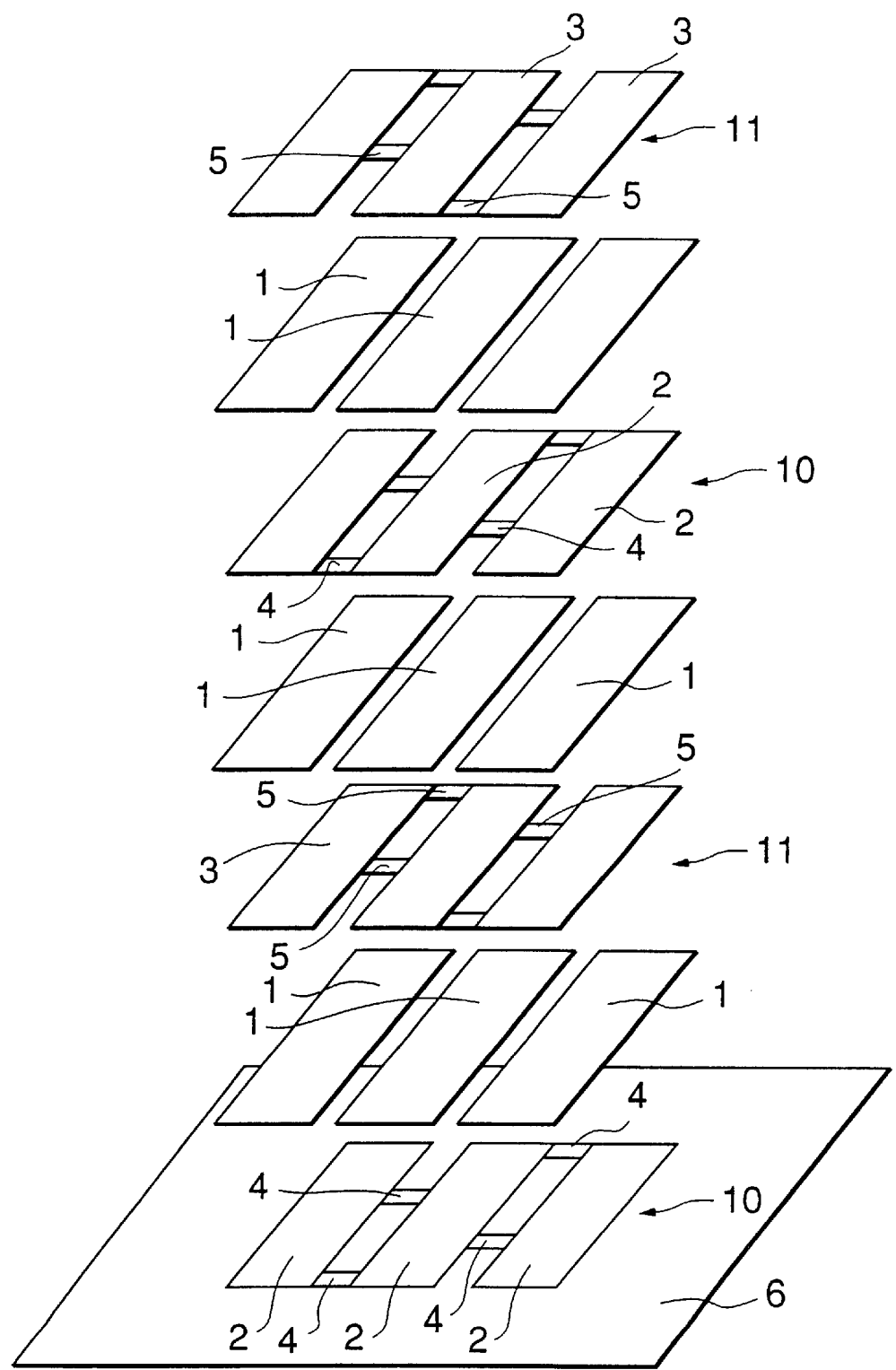

A laminated thin-film capacitor, as shown in FIG. 15d, having 6 dielectric layers was prepared in the same manner as in Example 15 and was evaluated. A capacity component was 106 nF and an inductance component was 18 pH. Observation through the SEM indicated that the dielectric layers possessed a thickness of 0.5 μm.

Example 17

A single-plate thin-film capacitor was prepared in the same manner as in Example 15 but forming the dielectric layers by using a sintered product of $Pb(Zr_{0.53}Ti_{0.47})O_3$ as a target for forming the dielectric layers, and was evaluated. A capacity component was 10.0 nF and an inductance component was 18 pH. Observation through the SEM indicated that the dielectric layers possessed a thickness of 0.4 μm.

Example 18

A single-plate thin-film capacitor was prepared in the same manner as in Example 15 but forming the dielectric layers according to Example 3, and was evaluated. A capacity component was 28 nF and an inductance component was 17 pH. Observation through the SEM indicated that the dielectric layers possessed a thickness of 0.8 μm.

Example 19

A single-plate thin-film capacitor was prepared in the same manner as in Example 18 but changing the gaps X, Y among the solder bumps and so changing the positions of the terminal electrode layers that the current paths were changed from those shown in FIG. 14a into those shown in FIG. 14b. The results were as shown in Table 1. Thicknesses of the dielectric layers were all 0.8 μm.

TABLE 1

| Sample No. | Current path | X (mm) | Y (mm) | Outer shape (mm$^2$) | Total electrode area (mm$^2$) | Capacity (nF) | Inductance (pH) |
| --- | --- | --- | --- | --- | --- | --- | --- |
| 1 | 14a | 0.5 | 0.5 | 1.5 × 2.0 | 1.0 | 28 | 17 |
| 2 | 14b | 0.5 | 0.5 | 1.5 × 2.0 | 1.0 | 28 | 27 |
| 3 | 14a | 0.8 | 0.8 | 1.7 × 3.0 | 2.3 | 75 | 29 |
| 4 | 14b | 0.8 | 0.8 | 1.7 × 3.0 | 2.3 | 75 | 42 |
| 5 | 14a | 1.0 | 1.0 | 2.0 × 3.5 | 3.5 | 115 | 35 |
| 6 | 14b | 1.0 | 1.0 | 2.0 × 3.5 | 3.5 | 115 | 52 |

It will be understood from Table 1 above that the inductance increases with an increase in the gap among the solder bumps. In all of the cases, however, the inductance can be decreased by so arranging the neighboring external terminals as to possess dissimilar polarities as shown in FIG. 14a.

Example 20

A magnesium ethoxide and a niobium ethoxide were weighed at a molar ratio of 1.05:2, and were refluxed in a 2-methoxyethanol (at 130° C. for 17 hours) to synthesize an MgNb composite alkoxide solution of a concentration of 1 M (mol/l). Absorption due to an Mg—O—Nb bond was observed in the IR spectrum near 656 cm$^{-1}$.

Next, a Ti propoxide and a Zr propoxide were separately dissolved in the 2-methoxyethanol at room temperature to prepare a Ti solution and a Zr solution of a concentration of 1M. The Ti solution and the Zr solution of a concentration of 1M were mixed into the MgNb composite alkoxide solution at a ratio of (Mg+Nb):Ti:Zr=1−x−y:x:y. Thereafter, acetylacetone was added in an amount equal to the amount of the whole metals in the Mg—Nb solution, and the mixture was stirred at room temperature for 10 minutes and was stabilized.

The lead acetate-trihydrate and the 2-methoxyethanol were mixed into the Mg—Nb—Ti—Zr solution at such a ratio that Pb:(Mg+Nb+Ti+Zr)=1.05:1, and the mixture was stirred at room temperature for one hour to synthesize a $Pb_{1.05}(Mg_{1.05/3}Nb_{2/3})_{1-x-y}Ti_xZr_yO_3$ (x=0.05, y=0.10) precursor solution of a concentration of 1M.

The precursor solution was applied onto the surfaces of the electrode layers by using a spin coater, dried, and was heat-treated at 380° C. for one minute to form a gel film. The application of solution and the heat treatment were repeated ten times. Then, the film was fired (in the open air) by quickly raising the temperature to 845° C. for 0.5 minutes to obtain a dielectric layer having a thickness of 0.80 μm.

Analysis by the X-ray diffraction measurement indicated that the dielectric thin film 3 contained the pyrochlore crystal phase having a composite of $Pb_{1.83}Nb_{1.71}Mg_{0.29}O_{6.39}$ and the perovskite crystal phase having a composite of $Pb(Mg_{1/3}Nb_{2/3})_{0.85}Ti_{0.05}Zr_{0.10}O_3$.

Based on the results of TEM (transmission electron microscope) observation, furthermore, the pyrochlore crystal particles and the perovskite crystal particles were measured for their average particle diameters by drawing lines on the portions where the perovskite crystal particles or the pyrochlore crystal particles exist alone in the direction of thickness and using the intercepting method. Further, the number of the perovskite crystal particles in the visual field was counted and was multiplied by the average particle diameters thereby to find the area of the perovskite crystal particles in the visual field and to find the area ratio (volume ratio) by dividing the above area by the area of the visual field.

As a result, the perovskite crystal particles possessed an average particle diameter of 0.39 μm, and the pyrochlore crystal particles possessed an average particle diameter of 0.021 μm. The forming ratio (area ratio) of the perovskite crystal particles in the dielectric layer was 87%. Besides, the dielectric layer had a structure as shown in FIG. 16 and the perovskite existence factor is represented by FIG. 17b. In the whole dielectric layer, the portions A where the perovskite existence factor is not smaller than 90% exist in amount of 60%.

A single-plate thin-film capacitor was prepared in the same manner as in Example 3 but forming the dielectric layer as described above, and was evaluated. As a result, the capacity component was 26.7 pF and the inductance component was 80 pH.

What is claimed is:

1. A thin-film capacitor in which a plurality of neighboring capacitor elements are arranged side by side, each capacitor element comprising:

a dielectric layer;

a first electrode layer formed on a lower surface of said dielectric layer;

a second electrode layer formed on an upper surface of said dielectric layer;

a first terminal electrode layer connecting the first electrode layers of the neighboring capacitor elements together;

a second terminal electrode layer connecting the second electrode layers of the neighboring capacitor elements together, wherein said first terminal electrode layers and said second terminal electrode layers are disposed so as not to overlap; and external terminals connected to said first and second terminal electrode layers, respectively, wherein at least one of the external terminals is disposed between neighboring capacitor elements.

2. A thin-film capacitor according to claim 1, wherein said first terminal electrode layers maintain a gap and said second terminal electrode layers maintain a gap.

3. A thin-film capacitor according to claim 1, wherein the first electrode layers of the capacitor elements disposed at either end of the capacitor are provided with third terminal electrode layers protruding outward, the second electrode layers of the capacitor elements disposed at either end of the capacitor are provided with fourth terminal electrode layers protruding outward, and said third terminal electrode layers and said fourth terminal electrode layers are provided with external terminals, respectively.

4. A thin-film capacitor according to claim 3, wherein at least one of the capacitor elements at either end of the capacitor further comprises a capacity addition portion constituted by the dielectric layers and the outward protruding electrode layers.

5. A thin-film capacitor according to claim 1, wherein said capacitor elements are arranged in a number of three or more.

6. A thin-film capacitor according to claim 5, wherein the first terminal electrode layers and the second terminal electrode layers alternatingly connect the neighboring capacitor elements as viewed from above, and the first terminal electrode layers formed on one side of one of said neighboring capacitor elements are opposed to the second terminal electrode layers formed on the other side of said capacitor element.

7. A thin-film capacitor according to claim 1, wherein said dielectric layers comprise perovskite crystal particles containing Pb, Mg, Nb, Ti and Zr as metal elements and pyrochlore crystal particles, and wherein regions constituting not less than 90% perovskite crystal particles in a thickness dimension of the dielectric layer represent from 50 to 90% of the dielectric layer.

8. A board comprising a dielectric substrate having a thin-film capacitor of claim 1 on the surface or in the inside thereof.

9. A thin-film capacitor in which a plurality of neighboring capacitor elements are arranged side by side, each capacitor element comprising:

a plurality of first electrode layers and a plurality of second electrode layers alternatingly stacked with one of the dielectric layers disposed between each pair of electrode layers;

a plurality of first terminal electrode layers for connecting the first electrode layers on one plane of the neighboring capacitor elements together;

a plurality of second terminal electrode layers for connecting the second electrode layers on one plane of the neighboring capacitor elements together, wherein said first terminal electrode layers and said second terminal electrode layers are disposed so as not to overlap; and external terminal connected to uppermost first terminal electrode layers and to uppermost second terminal electrode layers, respectively, wherein at least one of the external terminals is disposed between neighboring capacitor elements.

10. A thin-film capacitor according to claim 9, wherein the first electrode layers on one plane are connected together by a plurality of first terminal electrode layers, and the second electrode layers on one plane are connected together by a plurality of second terminal electrode layers.

11. A thin-film capacitor according to claim 9, wherein the first electrode layers of the capacitor elements located at either end of the capacitor are provided with third terminal electrode layers protruding outward, the second electrode layers of the capacitor elements located at either end of the capacitor are provided with fourth terminal electrode layers protruding outward, and external terminals are disposed on an uppermost third terminal electrode layer and on an uppermost fourth terminal electrode layer.

12. A thin-film capacitor according to claim 11, wherein at least one of the capacitor elements at either end of the capacitor further comprises a capacity addition portion constituted by the dielectric layers and the outward protruding electrode layers.

13. A thin-film capacitor according to claim 9, wherein said capacitor elements are arranged in a number of three or more.

14. A thin-film capacitor according to claim 13, wherein the first terminal electrode layers and the second terminal electrode layers alternatingly connect the neighboring capacitor elements as viewed from above, and the first terminal electrode layers formed on one side of one of said neighboring capacitor elements are opposed to the second terminal electrode layers formed on the other side of said capacitor element.

15. A thin-film capacitor according to claim 9, wherein said dielectric layers comprise perovskite crystal particles containing Pb, Mg, Nb, Ti and Zr as metal elements and pyrochlore crystal particles, and wherein regions constituting not less than 90% perovskite crystal particles in a thickness dimension of the dielectric layer represent from 50 to 90% of the dielectric layer.

16. A board comprising a dielectric substrate having a thin-film capacitor of claim 9 on the surface or in the inside thereof.

17. A thin-film capacitor in which a plurality of neighboring capacitor elements are arranged side by side, each capacitor element comprising:

a dielectric layer comprising perovskite crystal particles containing Pb, Mg, Nb, Ti and Zr as metal elements and pyrochlore crystal particles, wherein regions constituting not less than 90% perovskite crystal particles in a thickness dimension of the dielectric layer represent from 50 to 90% of the dielectric layer;

a first electrode layer formed on a lower surface of said dielectric layer;

a second electrode layer formed on an upper surface of said dielectric layer;

a first terminal electrode layer for connecting the first electrode layer of neighboring capacitor elements together;

a second terminal electrode layer for connecting the second electrode layer of neighboring capacitor elements together, wherein said first terminal electrode layer and said second terminal electrode layer are disposed so as not to overlap; and external terminals disposed on said first and second terminal electrode layers.

18. A thin-film capacitor in which a plurality of neighboring capacitor elements are arranged side by side, each capacitor element comprising:

a plurality of dielectric layers comprising perovskite crystal particles containing Pb, Mg, Nb, Ti and Zr as metal elements and pyrochlore crystal particles, wherein regions constituting not less than 90% perovskite crystal particles in a thickness dimension of the dielectric layers represent from 50 to 90% of each dielectric layer;

a plurality of first electrode layers and a plurality of second electrode layers alternatingly stacked with one of the dielectric layers disposed between each pair of electrode layers;

a plurality of first terminal electrode layers for connecting the first electrode layers on one plane of the neighboring capacitor elements together;

a plurality of second terminal electrode layers for connecting the second electrode layers on one plane of the neighboring capacitor elements together, wherein said first terminal electrode layers and said second terminal electrode layers are disposed so as not to overlap; and external terminals disposed on said first and second terminal electrode layers.

* * * * *